United States Patent [19]

Nakanishi et al.

[11] Patent Number: 5,336,907
[45] Date of Patent: Aug. 9, 1994

[54] MOS GATE CONTROLLED THYRISTOR HAVING IMPROVED TURN ON/TURN OFF CHARACTERISTICS

[75] Inventors: Hidetoshi Nakanishi, Kawasaki; Yasunori Usui, Yokohama, both of Japan

[73] Assignee: Kabushiki Kaisha Toshiba, Kawasaki, Japan

[21] Appl. No.: 969,491

[22] Filed: Oct. 30, 1992

[30] Foreign Application Priority Data

Oct. 31, 1991 [JP] Japan .................................. 3-311422

[51] Int. Cl.$^5$ ..................... H01L 29/74; H01L 29/10; H01L 29/78
[52] U.S. Cl. ...................... 257/133; 257/130; 257/132; 257/152; 257/153; 257/163; 257/167; 257/336
[58] Field of Search ............ 257/124, 125, 130, 132, 257/133, 137, 138, 147, 152, 153, 163, 167, 172, 177, 336

[56] References Cited

U.S. PATENT DOCUMENTS 5,155,569 10/1992 Ternshima .......................... 257/130

FOREIGN PATENT DOCUMENTS

| | | |
|---|---|---|
| 0219995 | 4/1987 | European Pat. Off. . |
| 0438700 | 7/1991 | European Pat. Off. . |
| 0476815 | 3/1992 | European Pat. Off. . |
| 4011509 | 10/1990 | Fed. Rep. of Germany . |
| 4025122 | 4/1991 | Fed. Rep. of Germany . |
| 63-310171 | 12/1988 | Japan . |

OTHER PUBLICATIONS

ISPSD '91, pp. 138-141, M. Nandakumar, et al., "The Base Resistance Controlled Thyristor (NRT), A New MOS Gated Power Thyristor".
Patent Abstracts of Japan, vol. 12, No. 273 (E-693)(3120), Jul. 29, 1988, & JP-A-63 053 972, Mar. 8, 1988.
IEEE Electron Device Letters, vol. 11, No. 6, Jun. 1990, pp. 256-257, M. W. Darwish, "A New Lateral MOS-Controlled Thyristor".
IEEE Transactions of Electron Devices, vol. ED-27, No. 2, Feb. 1980, pp. 380-387 J. D. Plummer, et al., "Insulated-Gate Planar Thyristors: I-Structure and Basic Operations".
Patent Abstracts of Japan, vol. 13, No. 150 (E-742)(3498), Apr. 12, 1989, & JP-A-63 310 171, Dec. 19, 1988.

Primary Examiner—Ngan Van Ngo
Attorney, Agent, or Firm—Oblon, Spivak, McClelland, Maier & Neustadt

[57] ABSTRACT

A gate electrode includes a first region formed in an OFF gate region and a second region formed in an ON gate region. A P-channel region is formed in the OFF gate region and an N-channel region is formed in the ON gate region to separate these gate regions. Since a P$^-$-type channel region of low impurity concentration is formed at an end of a P-type base region in which the N-channel region is formed, the impurity concentration of the P-type base region can be increased and thus turn-off characteristic is improved.

12 Claims, 17 Drawing Sheets

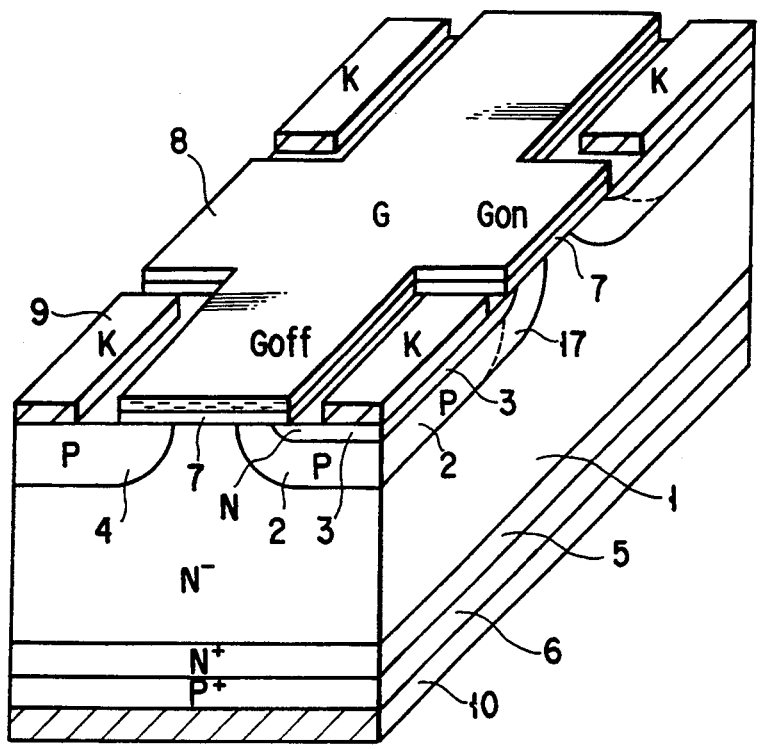
F I G. 6
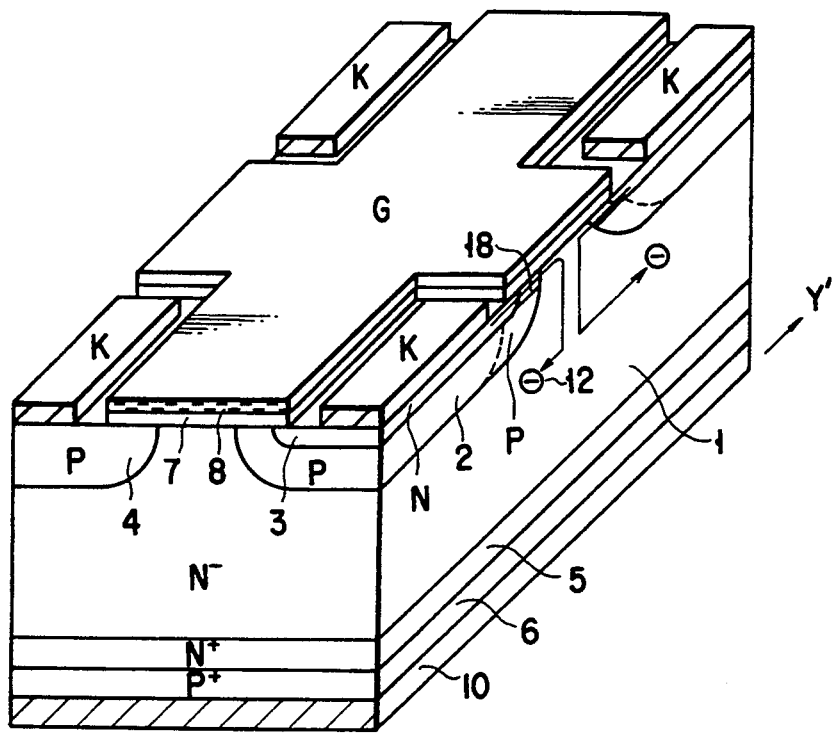
F I G. 7

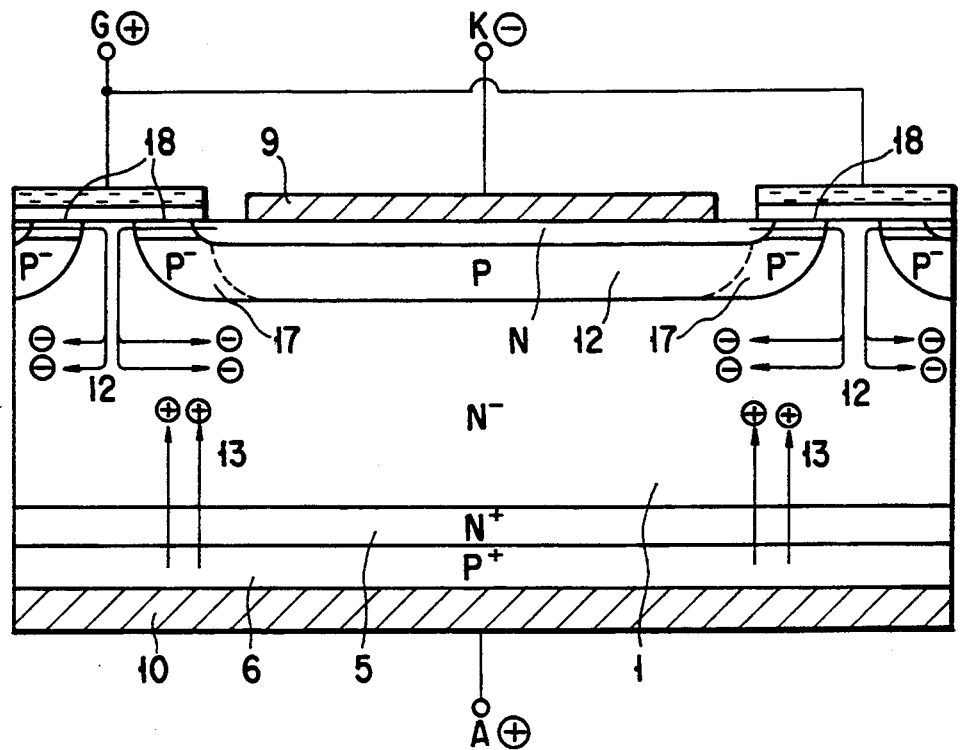
F I G. 8
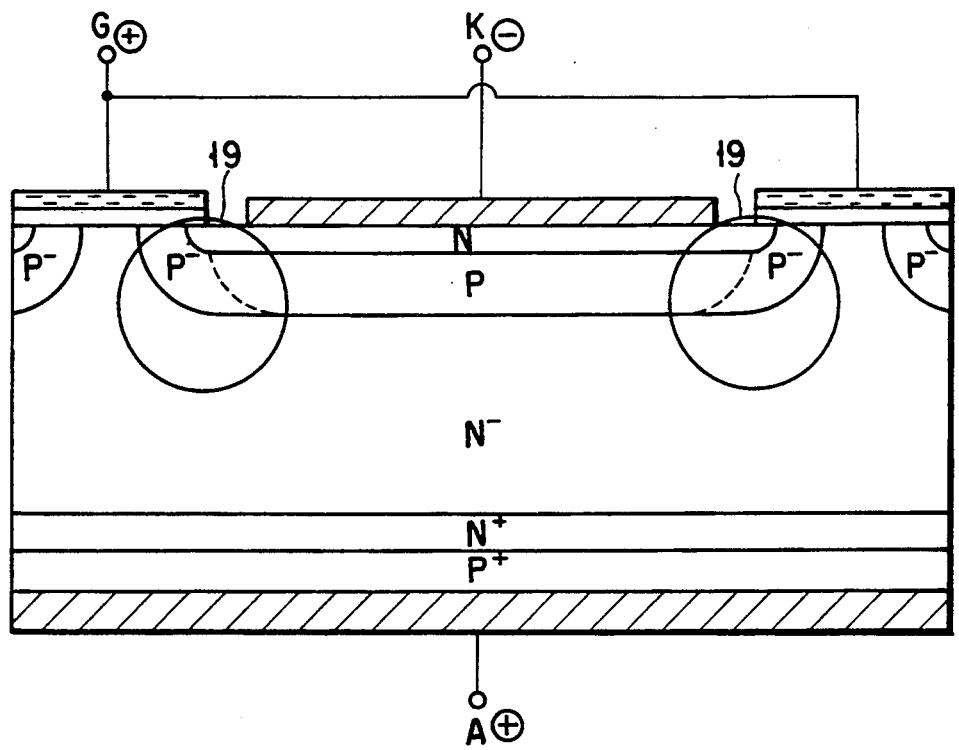
F I G. 9

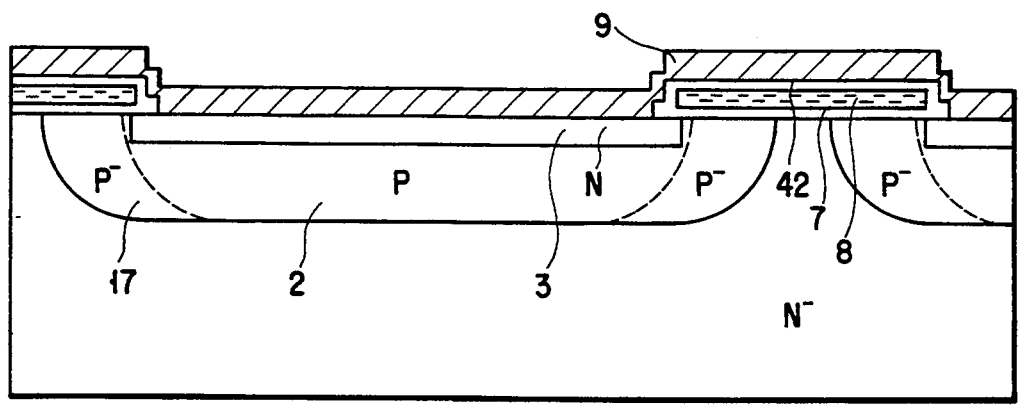
F I G. 12
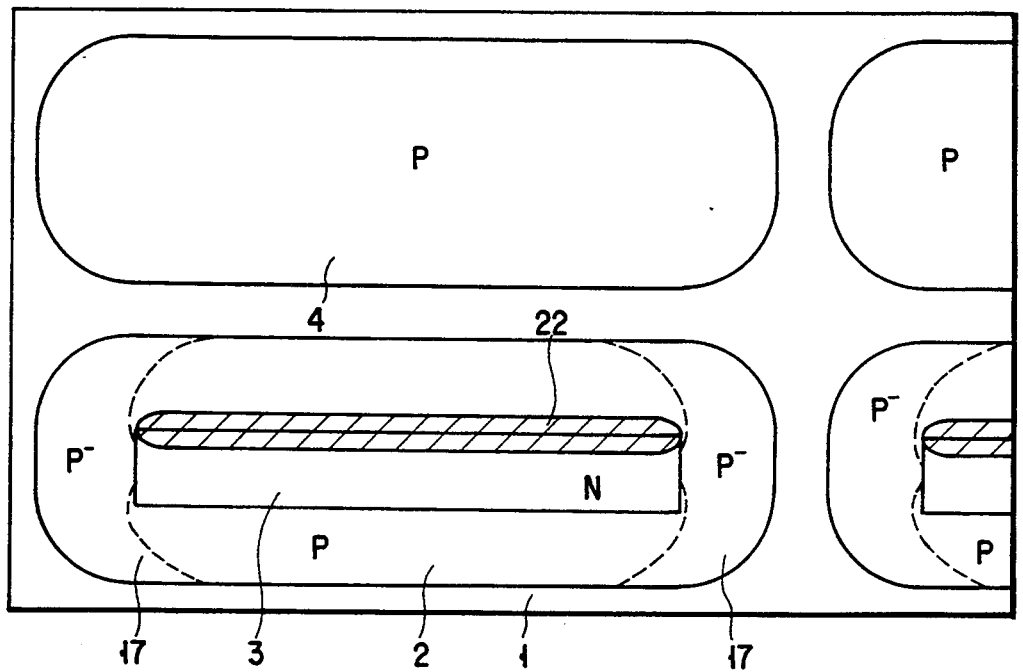
F I G. 13

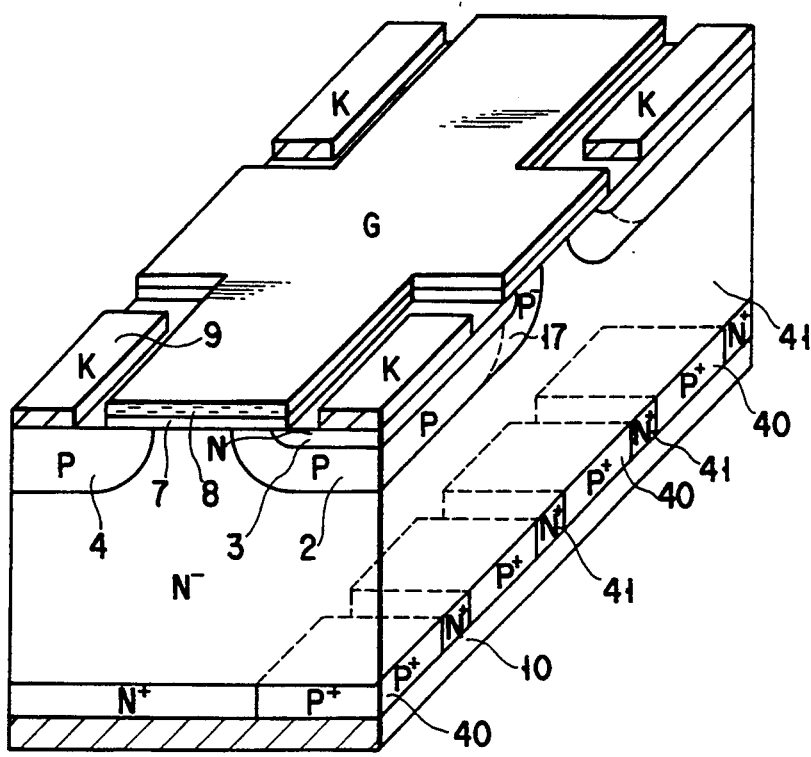
F I G. 18
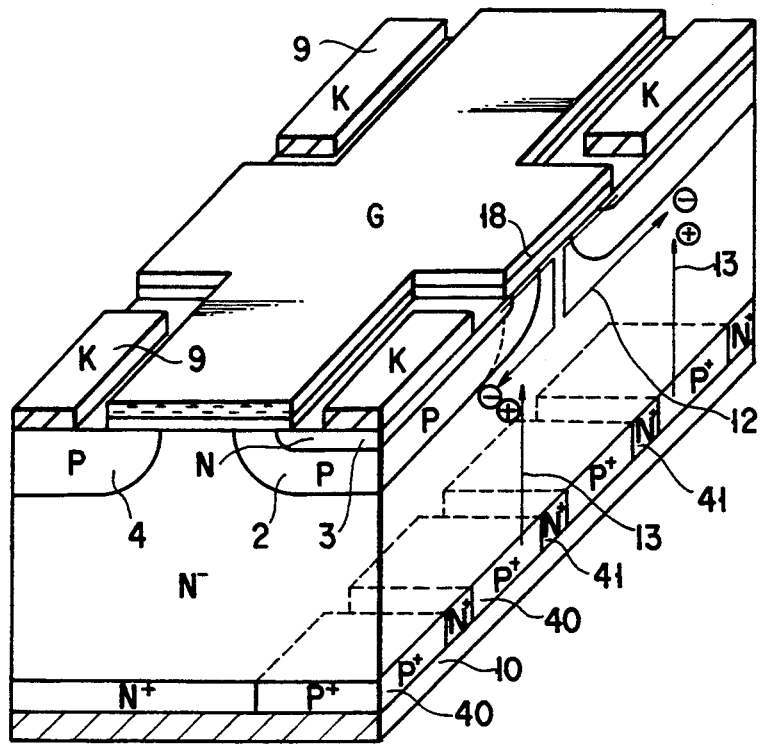
F I G. 19

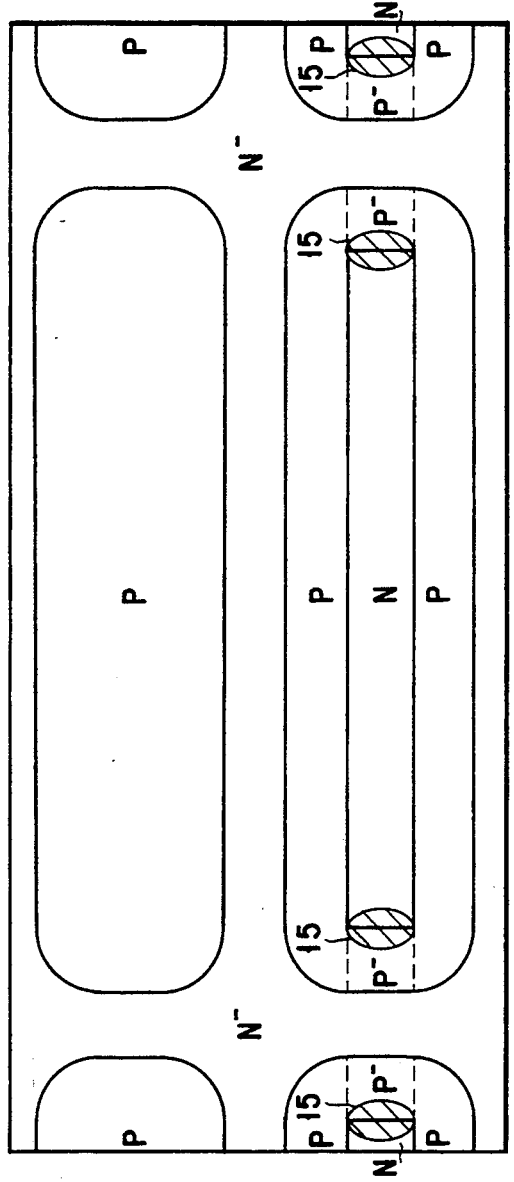
F I G. 25A
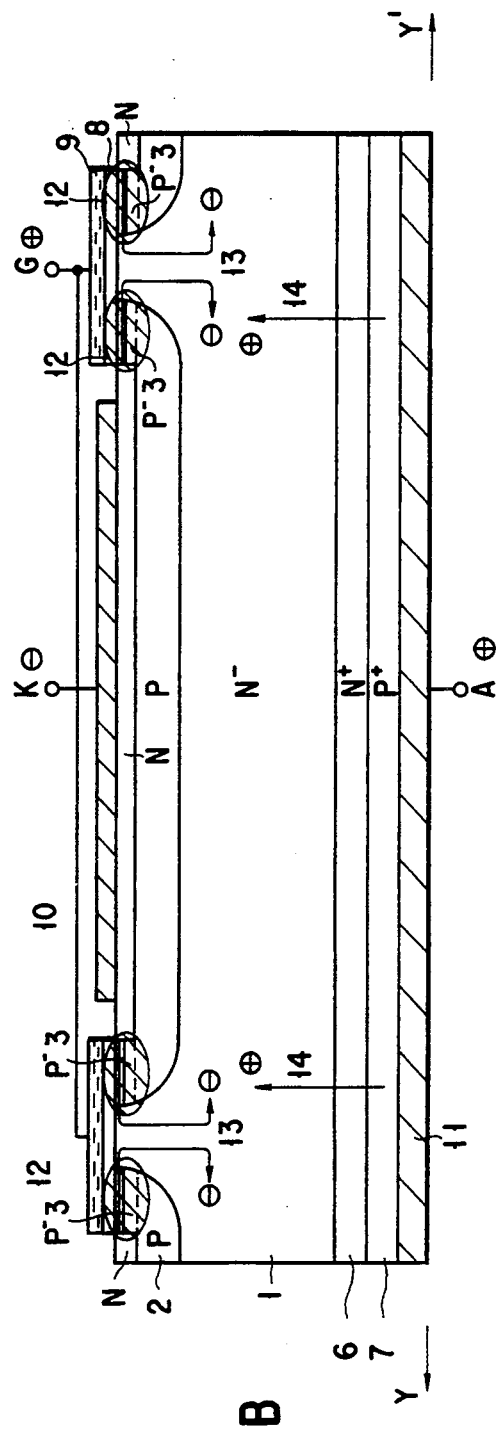
F I G. 25B

MOS GATE CONTROLLED THYRISTOR HAVING IMPROVED TURN ON/TURN OFF CHARACTERISTICS

BACKGROUND OF THE INVENTION

1. Field of the Invention

The present invention relates to a structure of a MOS gate controlled thyristor (hereinafter referred to as MCT) capable of turning on/off a MOS gate by changing a polarity of voltage applied thereto.

2. Description of the Related Art

An MCT is a thyristor whose emitter and base have the same conductivity type and are short-circuited by a MOS gate type transistor when a voltage is applied to a gate electrode of the transistor. This turn-off operation requires a small amount of gate power only because the thyristor controls power consumption, and no self-turn-off operation can be performed in this thyristor. Therefore, a MOS type thyristor is known in which a control electrode is provided at a base whose conductivity type is opposite to that of the above base, and a negative bias is applied to the control electrode to discharge part of anode current as base current, thereby performing a self-turn-off operation.

FIG. 1 is a perspective view of a conventional MCT, which is disclosed in IEEE, 1991, pp. 138–141. As shown in FIG. 1, impurities are diffused into the first major surface of an N⁻ silicon semiconductor substrate 1 to form a P-type base region 2 and a P+-type emitter region 4, and an N-type emitter region 3 is formed in the P-type base region 2. Further, semiconductor layers are grown in sequence on the second major surface, i.e., the undersurface of the semiconductor substrate 1 to form an N+-type layer 5 and a P+-type layer 6 serving as a buffer region and an undersurface P+-type emitter region, respectively. An anode electrode 10 ( A ) is formed on the undersurface P+-type emitter region 6. On the first major surface, a gate oxide film 7 is formed so as to overlap the N⁻-type semiconductor substrate 1, P-type base region 2, N-type emitter region 3, and P+-type emitter region 4. A polysilicon gate electrode 8(G) is formed on the gate oxide film 7. The gate oxide film 7 and gate electrode 8 are partially removed and opened to form a cathode electrode 9(K) in the opened area on the N-type emitter region 3 and P+-type emitter region 4.

An operation (turn-on and turn-off) of the above conventional MCT will now be described.

First a turn-off operation will be described with reference to FIGS. 2 and 3. As shown in FIG. 2, when the anode A is positively biased and the cathode K is negatively biased, a positive voltage is applied to the gate G, an N-channel MOSFET constituted by the semiconductor substrate (N⁻-type base region) 1, P-type base region 2, and N-type emitter region 3 is operated to form an inversion layer 11 and inject electrons 12 from the N-type emitter region 3 into the N⁻-type base region 1. As shown in FIG. 3, since the electrons are injected into the N⁻-type base region 1, holes are injected from the undersurface P+-type emitter region 6 into the N⁻-type base region 1 to vary the conductivity. The MCT is thus turned on to cause a main current 14 to flow.

Next a turn-off operation will be described with reference to FIGS. 4 and 5. When the anode A is positively biased, the cathode K is negatively biased, and the main current 14 flows, a negative bias is applied to the gate G, and a P-channel MOSFET constituted by the N⁻-type base region 1, P-type base region 2, and P+-type emitter region 4 is operated to form an inversion layer 15. Therefore, the P-type base region 2 and cathode electrode 9 are short-circuited, and the P+-type emitter region 4 and cathode electrode 9 are short-circuited, and holes 16 in the main current are discharged from these paths connecting the regions 2 and 4 and the cathode electrode 9. When the holes 16 are discharged, the electrons are prevented from flowing from the N-type emitter region 3, and the main current is stopped. The turn-off operation is thus completed. The MCT is a self turn-off element capable of the turn-on and turn-off operations described above.

However, the above-described MCT has a drawback in that the turn-off operation is difficult to perform because the MCT tends to turn on in view of its operation characteristic. At present, an improvement in turn-off characteristic is advanced. To improve the turn-off characteristic of the MCT, the concentrations of the P-type base region 2 and P+-type emitter region 4 have to increase. In the turn-off operation shown in FIGS. 4 and 5, when the holes are discharged from the main current to the cathode electrode 9 by virtue of the inversion layer 15 formed by the operation of the P-channel MOSFET, the discharge efficiency of the holes is influenced by the sheet resistances of the P-type base region 2 and P+-type emitter region 4. To improve the discharge efficiency, the concentrations of the P-type base region 2 and P+-type embitter region 4 have to increase, and the sheet resistances thereof have to decrease. If, however, the turn-off characteristic has priority over the turn-on characteristic and the P-type base region 2 is increased in concentration, the turn-on characteristic is deteriorated. More specifically, in the turn-on operation shown in FIG. 2, the N-channel MOSFET is operated to form the inversion layer 11, and the electrons are injected from the N-type emitter region 3 into the N⁻-type base region 1 to vary the conductivity and cause the main current to flow. If the concentration of the P-type base region is increased, the threshold voltage of the N-channel MOSFET is increased and the on-voltage is also increased, resulting in a great loss in the turn-on operation.

As described above, the turn-on and turn-off characteristics of the MCT correlate with each other and, if one of the characteristics is improved, the other is deteriorated, which causes drawbacks wherein a trade-off is difficult between the turn-on and turn-off characteristics and the turn-off characteristic is difficult to improve. The conventional MCT is disclosed in Published Unexamined Japanese Patent Application No. 63-310171. According to this publication, a conventional five-layer structure is changed to a four-layer structure of pnpn to simplify a manufacturing process, and the short-circuit resistance of an emitter is lowered to perform a high-speed turn-off operation, but the drawback of difficulty in the trade-off between the turn-on and turn-off characteristics cannot be eliminated.

SUMMARY OF THE INVENTION

An object of the present invention is to provide a semiconductor device with an improvement in the trade-off between turn-on and turn-off characteristics optimization and in the turn-off characteristic over conventional device.

According to the present invention, a P⁻-type base region whose impurity concentration is lower than that of a P-type base region of a unit cell of an MCT, is formed at an end portion of the P-type base region to form an initial operation region for a turn-on operation, and the efficiency of the turn-on operation is increased to improve the trade-off between the turn-on and turn-off characteristics.

A semiconductor device according to the present invention comprises:

a first semiconductor region of a first conductivity type exposed to a first major surface of a semiconductor substrate;

a second semiconductor region of a second conductivity type formed in the first semiconductor region and exposed to the first major surface;

a third semiconductor region of the first conductivity type formed in the second semiconductor region and exposed to the first major surface;

a fourth semiconductor region of the second conductivity type formed in the first semiconductor region and exposed to the first major surface;

a fifth semiconductor region of the second conductivity type formed in the first semiconductor region and exposed to a second major surface of the semiconductor substrate;

a first electrode electrically connected to the third and fourth semiconductor regions;

a gate electrode formed on the first major surface with a gate oxide film interposed therebetween and including a first region serving as an OFF gate region formed on a boundary between the first and second semiconductor regions, a boundary between the first and fourth semiconductor regions, and the first semiconductor region interposed between these boundaries, and a second region serving as an ON gate region formed on a boundary between the first and second semiconductor regions, a boundary between the second and third semiconductor regions, and the second semiconductor region interposed between these boundaries; and a second electrode formed on the fifth semiconductor region.

A sixth semiconductor region is formed under the second region and its impurity concentration can be set lower than that of a portion of the second semiconductor region other than the sixth semiconductor region. The second semiconductor region covers an end of the third semiconductor region so as not to contact the third and sixth semiconductor regions in a region other than an ON-channel region. A contact portion of the third and sixth semiconductor regions can be set shorter than that of the second and third semiconductor regions on the first major surface of the semiconductor substrate. Further, the semiconductor device comprises a seventh semiconductor region of the first conductivity type whose impurity concentration is higher than that of the first semiconductor region. The fifth semiconductor region exposed to the second major surface is formed directly under the second semiconductor region.

A plurality of semiconductor devices each having the above structure, are formed in a single semiconductor substrate, and the semiconductor substrate includes a first side on which an OFF-channel region is formed and a second side adjacent to the first side, on which an ON-channel region is formed.

Since an initial turn-on region for the turn-on operation is formed away from that for the turn-off operation, the impurity concentration of the P-type base region is partially changed to improve the turn-on characteristic.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a perspective view of an MCT according to a first embodiment of the present invention;

FIG. 7 is a schematic perspective view for explaining a turn-on operation of the MCT shown in FIG. 6;

FIGS. 8 and 9 are cross-sectional views taken along line Y—Y' of FIG. 7 to explain the turn-on operation of the MCT;

FIG. 12 is a cross-sectional view of the semiconductor device shown in FIG. 11;

FIG. 13 is a plan view of a semiconductor device for explaining the turn-off operation of the MCT shown in FIG. 6;

FIG. 18 is a perspective view of an MCT according to a third embodiment of the present invention;

FIG. 19 is a perspective view for explaining a turn-on operation of the MCT shown in FIG. 18;

FIGS. 25A, 25B and 25C and 26A, 26B and 26C are views for explaining turn-on and turn-off operations of the MCT shown in FIG. 24.

DETAILED DESCRIPTION OF THE PREFERRED EMBODIMENTS

Figure 1:
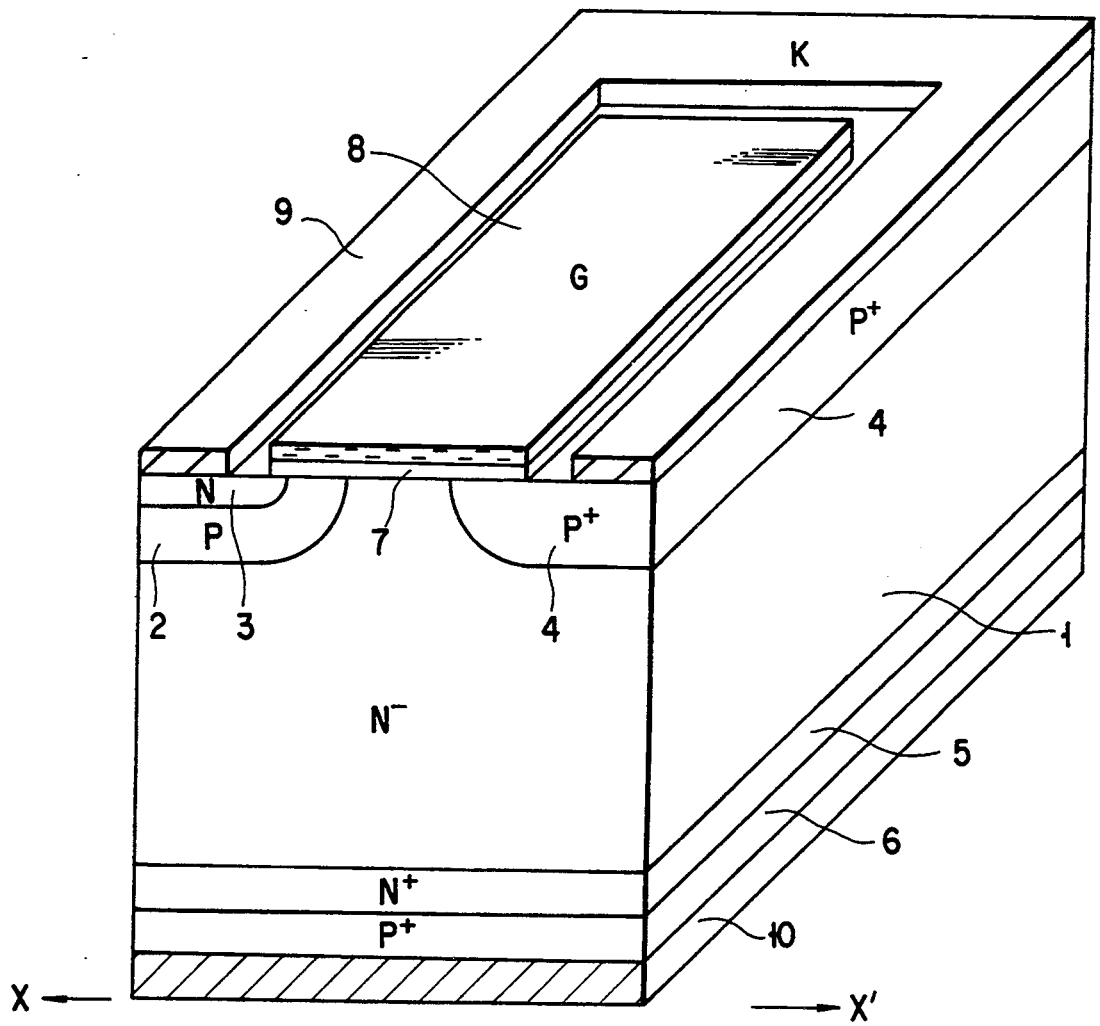
FIG. 1 is a schematic perspective view of a conventional MCT.
Figure 2:
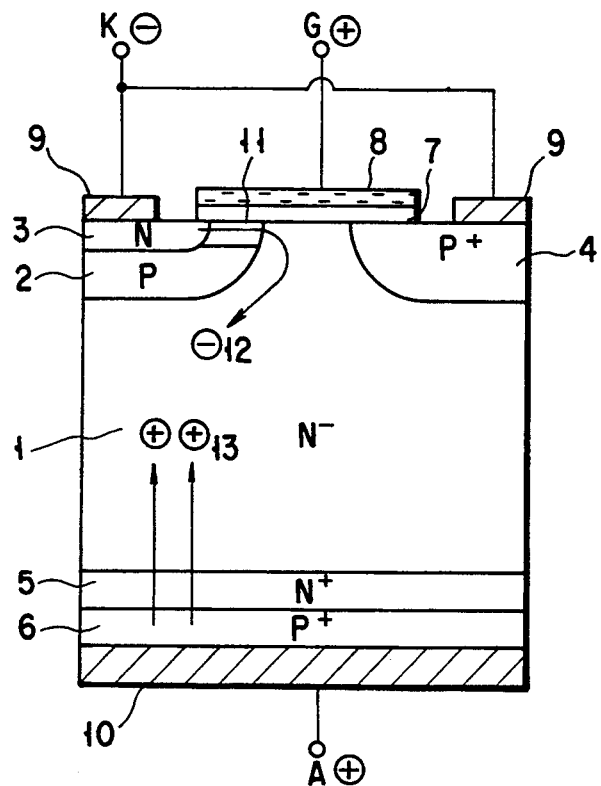
FIGS. 2 and 3 are cross-sectional views taken along line X—X' of FIG. 1 to explain a turn-on operation of the conventional MCT.
Figure 3:
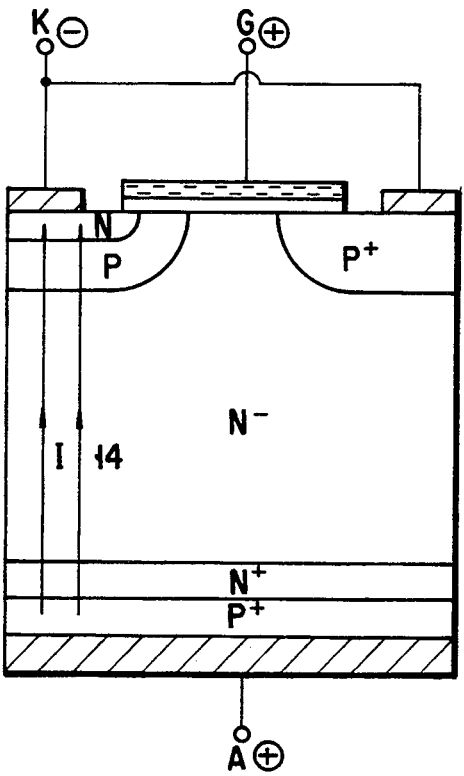
Figure 4:
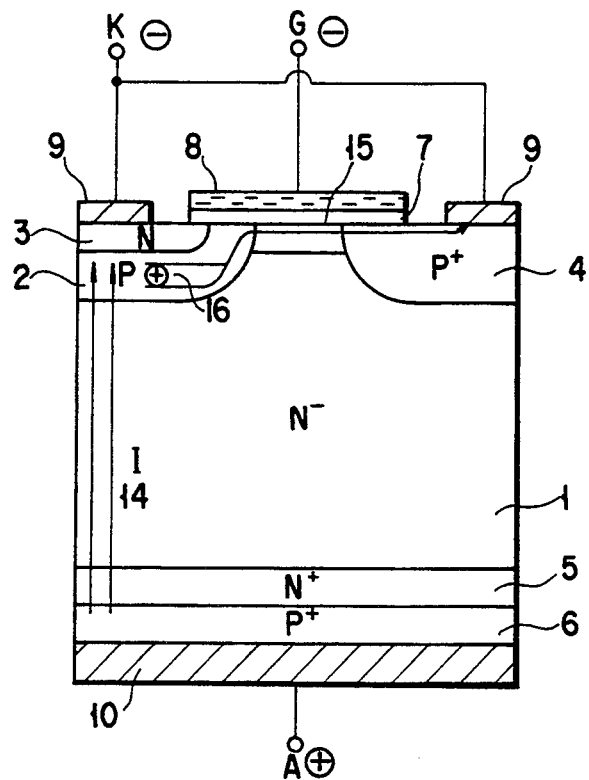
FIGS. 4 and 5 are cross-sectional views taken along line X—X' of FIG. 1 to explain a turn-off operation of the conventional MCT.
Figure 5:
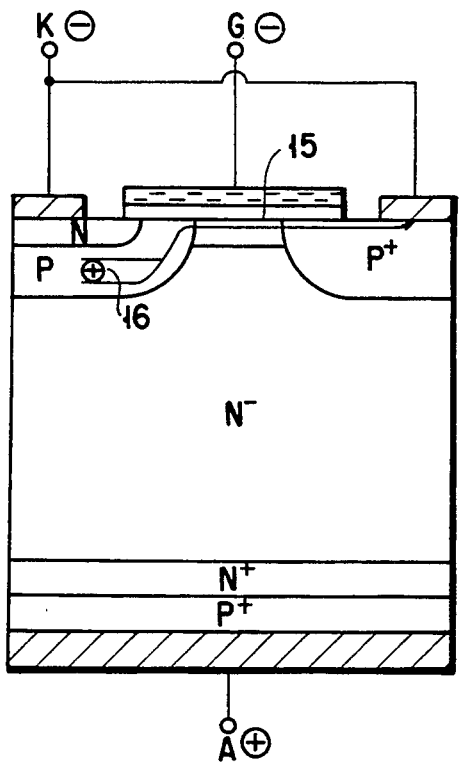

Embodiments of the present invention will now be described, with reference to the accompanying drawings. A first embodiment of the present invention will be described with reference to FIGS. 6 to 14. FIG. 6 is a schematic perspective view of a unit cell of a semiconductor device according to the first embodiment. As shown in FIG. 6, N+- and P+-type epitaxial growing layers 5 and 6, which serve as an N+-type buffer region 5 and an undersurface P+-type emitter region 6, are formed on the undersurface, i.e., the second major surface of an N⁻-type silicon semiconductor substrate 1, and an anode electrode 10(A) is formed on the undersurface P+-type emitter region 6. The structure on the second major surface of the semiconductor substrate is the same as that in the conventional MCT described above (FIG. 1). On the first major surface side, a P-type base region 2 is formed in the semiconductor substrate 1, an N-type emitter region 3 is formed in the base region 2, and a P-type emitter region 4 is formed in an N⁻-type base region 1 of the semiconductor substrate. The N-type emitter region 3, P-type base region 2, N⁻-type base region 1, and P-type emitter region 4 serve as third, second, first and fourth semiconductor regions, respectively, and exposed to the first major surface. The second semiconductor region (P-type base region 2) includes a low-concentration region 17, and is interposed between the first semiconductor region (N⁻-type base region 1) and the third semiconductor region (N-type emitter region 3) near its exposed portion. An electrode 8(G) is formed on the first major surface with a cathode electrode 9(K) and a gate oxide film 7 interposed therebetween. The gate electrode 8(G) includes first and second regions. The first region Goff (OFF gate region) is formed on the N⁻-type base region 1 interposed between a boundary between the N⁻-type base region 1 and P-type base region 2 and a boundary between the N⁻-type base region 1 and P-type emitter region 4. The second region Gon (ON gate region), which is spaced away from the first region Goff, is formed on the P⁻-type base region 17 interposed between a boundary between the N⁻-type base region 1 and P⁻-type base region 17 and a boundary between the P⁻-type base region 17 and N-type emitter region 3.

A process of manufacturing the semiconductor device will be described. The N+- and P+-type layers are grown on the second major surface of the N⁻-type silicon semiconductor substrate 1 to form the N+-type buffer region 5 and undersurface P+-type emitter region 6. The semiconductor substrate serves as an N⁻-type base region 1, a silicon oxide film and a polysilicon film are formed on the first major surface of the substrate using a well-known technique, and these films are selectively etched to form the gate oxide film 7 and gate electrode 8(G). Impurities are then diffused from the first major surface into a part of the N⁻-type base region 1 to form the P⁻-type base region 17. Impurities are diffused into another part of the base region 1 and the base region 17 to form the P-type emitter region 4 on the N⁻-type base region 1 and the P-type base region 2 on the P⁻-type base region 17. The N-type emitter region 3 is formed in the P-type base region 2. These diffusion regions are formed by ion-implantation, and the gate electrode is then used as a mask. Since the N-type emitter region 3 is formed so as to somewhat intrude to the inner side of the first region Goff (OFF gate region) of the gate electrode 8, the first region Goff is formed to overlap the N-type emitter region 3, P-type base region 2, N⁻-base region 1, and P-type emitter region 4. However, the gate electrode does not have to overlap the N-type emitter region 3 since only a channel formed between the P-type base and emitter regions 2 and 4 is necessary. Unless the gate electrode is used as a mask, the first region Goff has only to cover the P-type base region 2, N⁻-type base region 1, and P-type emitter region 4. The silicon oxide film is partially opened to form the cathode electrode 9(K) on the N- and P-type emitter regions 3 and 4 and to form the anode electrode 10(A) on the undersurface of the semiconductor substrate. The N+-type buffer region 5 and undersurface P+-type emitter region 6 can be formed by diffusing impurities into the semiconductor substrate. The feature of the semiconductor device according to the first embodiment lies in that the P⁻-type base region 17 of low concentration is formed at one end of the P-type base region 2 in the longitudinal direction of the cell of the semiconductor device.

Though the N⁻-type silicon substrate is used in the first embodiment, a P+-type silicon substrate can be substituted therefor. More specifically, the N+-type buffer region 5 and the N⁻-type base region 1 are grown in sequence on the P+-type silicon semiconductor substrate serving as the P+-type emitter region 6. Then, the P-type base region 2 and P-type emitter region 4 are formed by diffusion on the surface of the N⁻-type base region 1, and the N-type emitter region 3 is formed by diffusion in the P-type base region 2. The method of forming the other regions is the same as that in the first embodiment. This method is well-known and can be applied to the following embodiments.

Since the P⁻-type base region 17 is formed at the end of the P-type base region 2, even when the impurity concentration of the P-type base region 2 is increased to improve the turn-off characteristic, an N-channel MOSFET serving as a switch for a turn-on operation is always formed in the P⁻-type base region 17, and thus its threshold voltage is not increased. The turn-on operation is performed in the N-type emitter region 3 serving as an initial operating region, near the P⁻-type base region, and extends to the central part of the N-type emitter region 1. More specifically, even though the impurity concentration of the P-type base region varies, the N-channel MOSFET always operates at a constant threshold voltage, the turn-on operation is performed in a region of low on-voltage serving as an initial operating region, and a region for the turn-on operation extends, thereby controlling the on-voltage. It is thus possible to improve the trade-off between the turn-on and turn-off operations of the MCT of the present invention. Furthermore, the length of the cell is adjusted to determine the ratio of the length to the width of the cell and the concentration of the base region; therefore, the trade-off between them is improved, and the turn-off characteristic can be improved.

An operation of the cell of the semiconductor device according to the first embodiment will be described in detail, with reference to FIGS. 7 to 14. FIGS. 7 to 9 show the turn-off operation of the cell, in which FIG. 7 is a perspective view of the cell, and FIGS. 8 and 9 are cross-sectional views taken along line Y—Y' in FIG. 7. A positive bias is applied to the anode A and a negative bias is applied to the cathode K to positively bias the gate. An inversion layer 18 is thus formed in the $P^-$-type base region 17. The N-channel MOSFET is operated in this base region 17, and electrons are injected from the N-type emitter region 3 to the $N^-$-type base region 1. Holes 13 are thus injected from the $P^+$-type undersurface emitter region 6 to vary the conductivity. First the $P^-$-type base region 17 is turned on and changed to an initial turn-on region 19, and then a region for the turn-operation extends to the central part of the cell, thereby completely turning on the cell.

Figure 10:
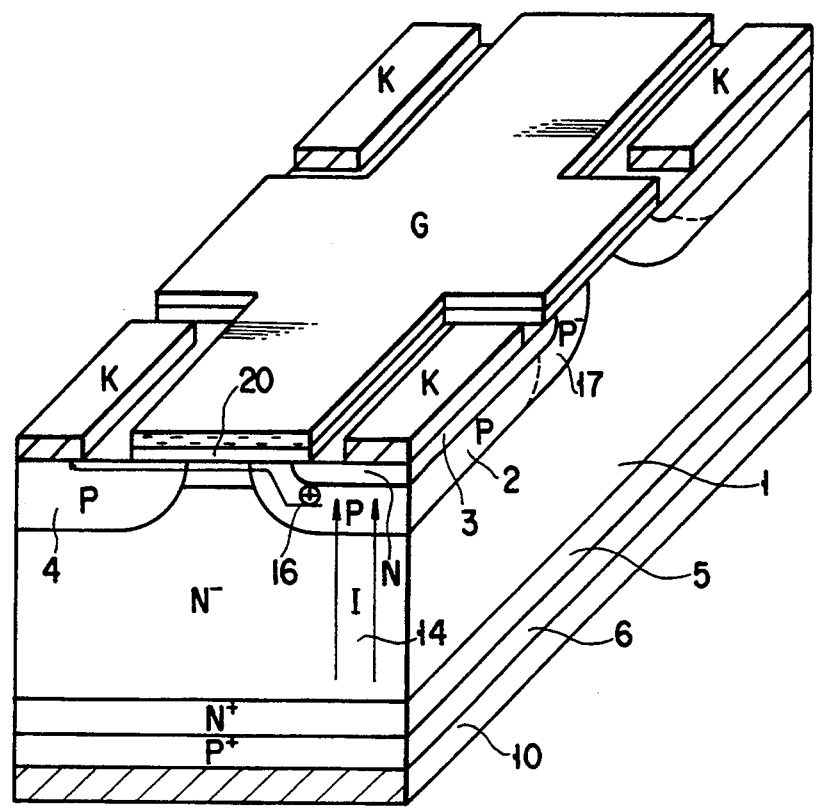
FIG. 10 is a perspective view for explaining a turn-off operation of the MCT shown in FIG. 6.

FIG. 10 is a perspective view of the cell of the semiconductor device for explaining the turn-off operation. A positive bias is applied to the anode A and a negative bias is applied to the cathode K, and the gate G is negatively biased while the main current is flowing. The P-channel MOSFET is operated to form an inversion layer 20, the P-type base and emitter regions 2 and 4, and the cathode electrode 9 are short-circuited, and holes 16 of the main current are discharged from the cathode electrode 9. Therefore, electrons are prevented from being injected from the N-type emitter region 3, and the main current 14(I) does not flow, resulting in completion of the turn-off operation.

Figure 11:
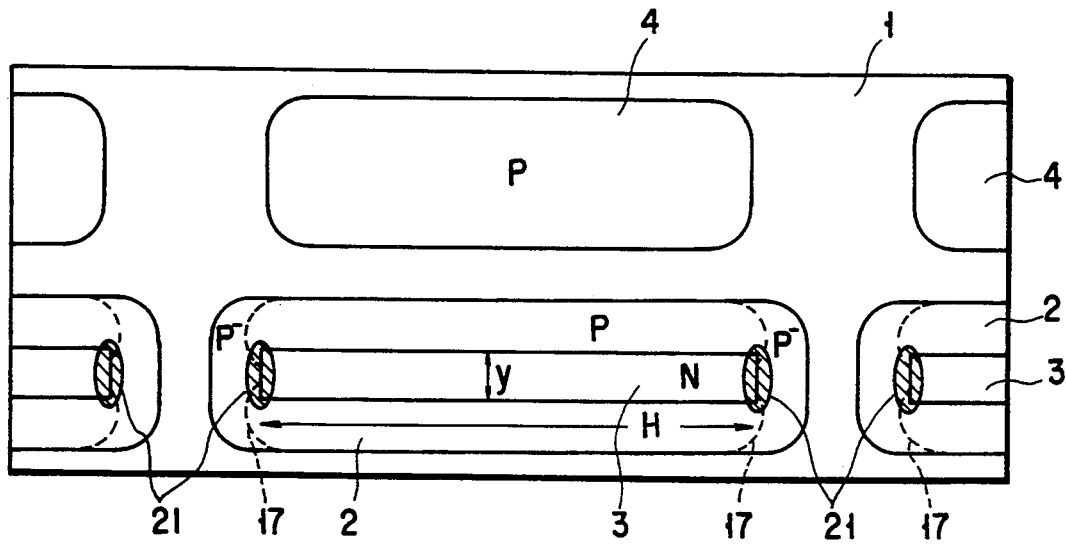
FIG. 11 is a plan view of a semiconductor device for explaining the turn-on operation of the MCT shown in FIG. 6.

FIGS. 11 and 13 are schematic plan views which respectively show initial operation regions of the semiconductor substrate for the turn-on and turn-off operations. The initial operation regions 21 for the turn-on operation are formed at both ends of the N-type emitter region 3 in the vicinity of the $P^-$-type base region 17, and the initial operation region 22 for the turn-off operation is formed along a connecting portion of the N-type emitter region 3 and the P-type base region 2. Since the turn-on operation starts from both ends of the N-type emitter region 3 and extends to the center thereof, the present invention differs from the conventional MCT (FIG. 1) whose turn-on and turn-off operations both start from the N-type emitter region 3 contacting the P-type base region 2.

Figure 14:
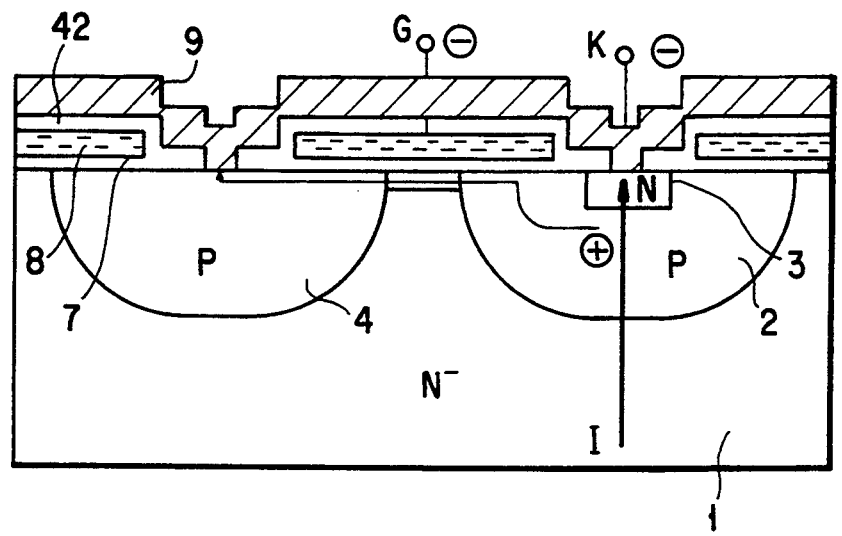
FIG. 14 is a cross-sectional view of the semiconductor device shown in FIG. 13.

Referring to FIGS. 11 to 14, the boundary between the N-type emitter region 3 and P-type base region 2, and the $P^-$-type base region 17, will be described. As shown in FIGS. 11 and 12, the P-type base region 2 and the N-type emitter region 3 formed therein, are lengthened in the same direction. The initial operation region 21 for the turn-on operation can be shortened as much as possible. The longer the initial operation region 22 for the turn-off operation, the better the turn-off characteristic. If, therefore, the ratio of these regions 21 and 22, i.e., the ratio of the short side (h) to the long side (H) is properly changed, either the turn-on characteristic or the turn-off characteristic can be emphasized and, in this case, it is necessary that the short side (h) should not exceed the long side (H). In this embodiment, h is about 5 μm, however, it can be set to 1 to 10 μm. The ratio of h to H is about 1 to 5 in this embodiment, however, it can be about 1 to 10 to improve the turn-off characteristic and can be about 1 to 3 to maintain the turn-on characteristic, at a little sacrifice of the turn-off characteristic. The $P^-$-type base regions 17 are formed so as to cover both ends of the P-type base region 2, that is, to cover the short sides of the N-type emitter region 3, and the P-type base region is formed so as to surround both ends of the N-type emitter region 3, thereby preventing the N-type emitter region 3 and $P^-$-type base region 17 from contacting each other. If these regions 3 and 17 are formed to contact each other, the $P^-$-type base region 17 affects the turn-off operation, and a conductive region in which holes are difficult to move when discharged in the turn-off operation, is easy to remain, thereby degrading the turn-off characteristic. FIG. 12 is a cross-sectional view showing the side of the MCT in FIG. 11 in which an ON gate region of the gate electrode 8 is formed, and FIG. 14 is also a cross-sectional view showing the side of the MCT in which an OFF gate region is formed. The gate electrode 8 and the cathode electrode 9 are insulated from each other by an interlayer insulation film.

Figure 21:
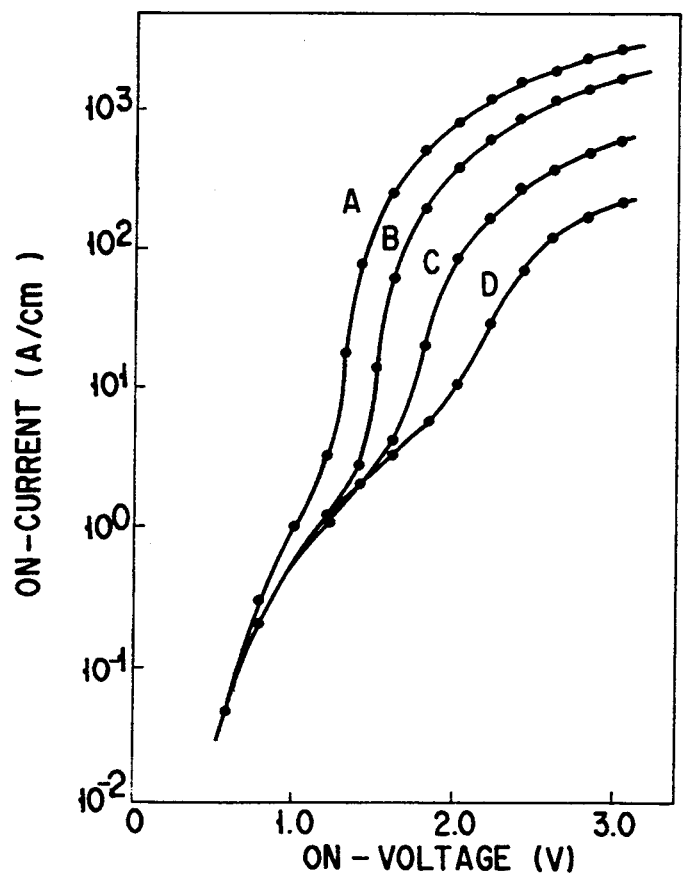
FIG. 21 is a graph showing impurity concentration dependence of the turn-on operation of the MCT of the present invention

The turn-on and turn-off characteristics of the MCT according to the present invention are improved by the $P^-$-type base region 17, but the current-voltage characteristic thereof depends upon the impurity concentration of the $P^-$-type base region 17, as shown in FIG. 21. FIG. 21 is a characteristic diagram in which the abscissa indicates on-voltage (v) and the ordinate indicates on-current (A/cm$^2$). Curves A, B, C and D show the current-voltage characteristics which are obtained when the impurity concentration of the N-type emitter region 3 is $2\times10^{20}/cm^2$, and that of the P-type base region 2 is $1.0\times10^{17}/cm^2$, $2.0\times10^{18}/cm^2$, $4.0\times10^{18}/cm^2$ and $5.0\times10^{18}/cm^2$, respectively. If the impurity concentration of the $P^-$-type base region 17 is lower, the current-voltage characteristic is improved. More specifically, if the impurity concentration of the region 17 is lower, a large amount of current can be caused to flow at a low voltage. Therefore, the turn-on characteristic is improved by forming the ON gate region of the P-type base region 2.

Figure 22:
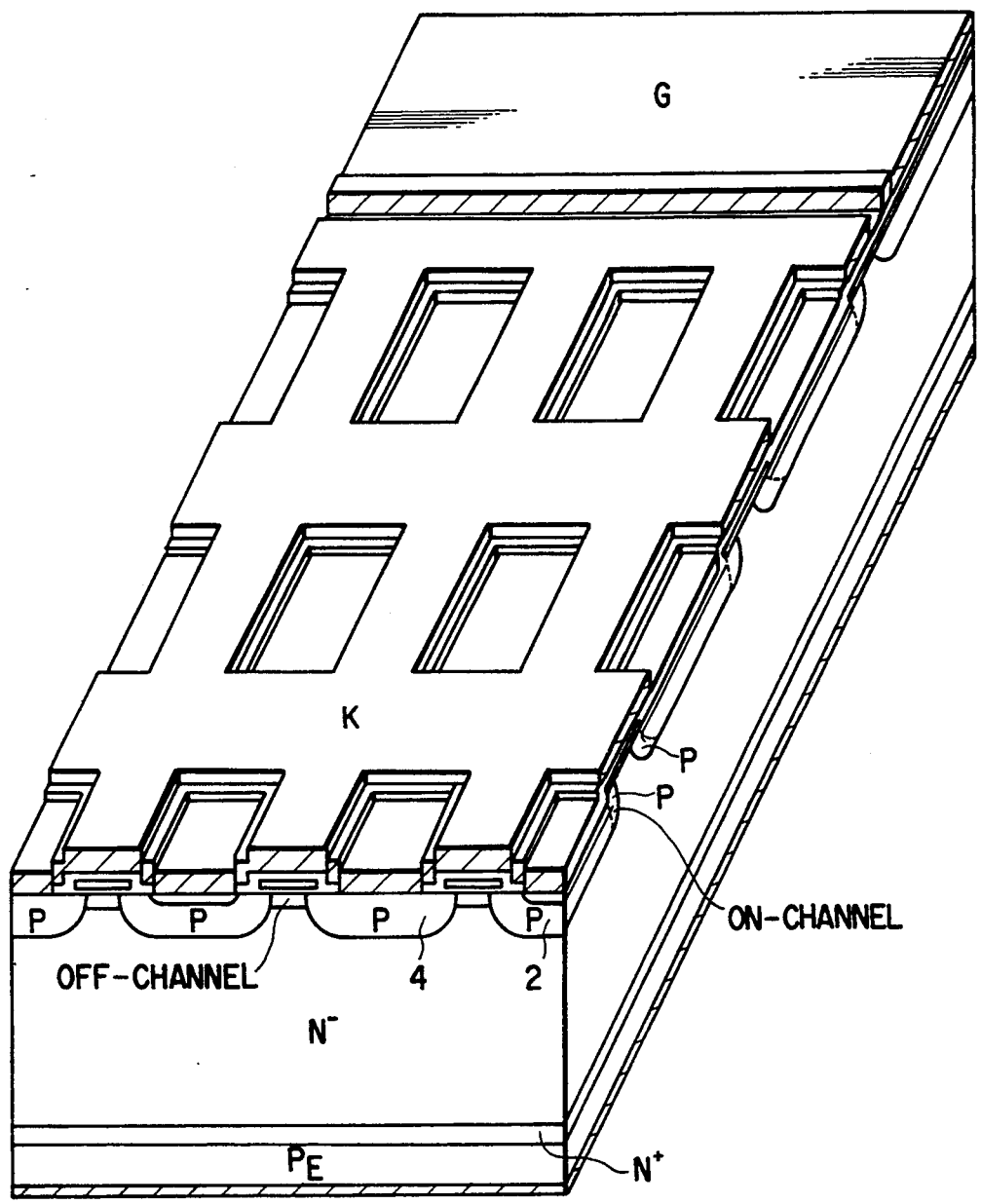
FIG. 22 is a perspective view of the MCT having a plurality of cells according to the present invention.

FIG. 22 is a perspective view of an MCT chip of the semiconductor device according to the present invention, which is formed from the semiconductor substrate having a plurality of cells. A plurality of pairs of P-type emitter regions 4 and P-type base regions including the $P^-$-type base regions 17 are formed in matrix on the first major surface of the semiconductor substrate, and the electrodes of the cells are connected to one another to form the gate G and cathode K of the MCT chip on the surface of the semiconductor substrate. As shown in FIG. 22, an off-channel is formed in the $N^-$-type base region 1 between the P-type base and emitter regions 2 and 4 under the Off gate region of the gate electrode, and an on-channel region is formed in the $P^-$-type base region 17 between the $N^-$-type base region 1 and N-type emitter region 3 under the ON gate region of the gate electrode. The size of the chip is about 2 to 4 mm.

Figure 15:
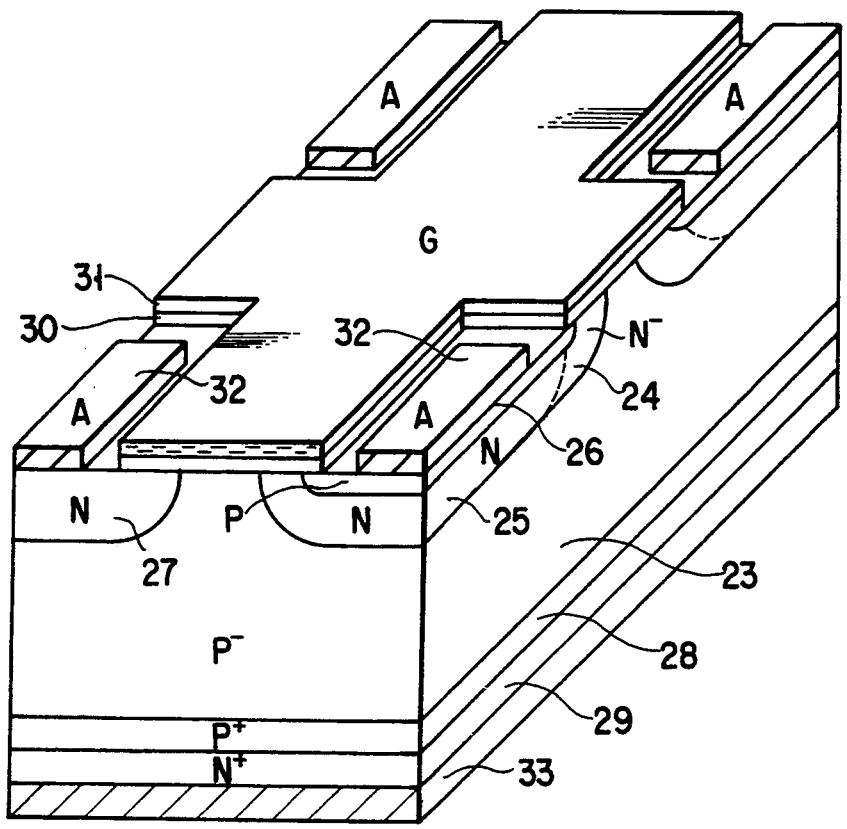
FIG. 15 is a perspective view of an MCT according to a second embodiment of the present invention.
Figure 16:
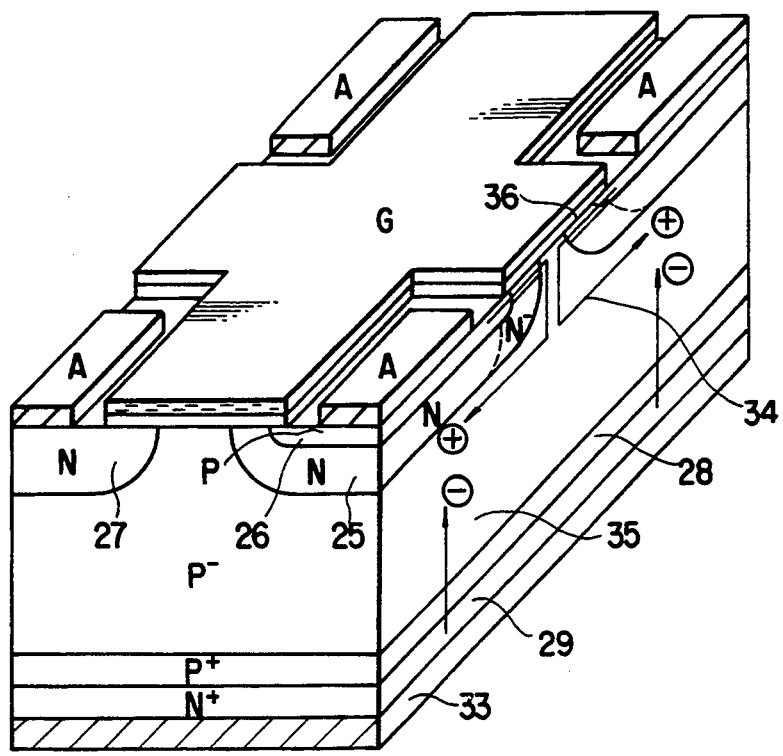
FIG. 16 is a perspective view for explaining a turn-on operation of the MCT shown in FIG. 15.
Figure 17:
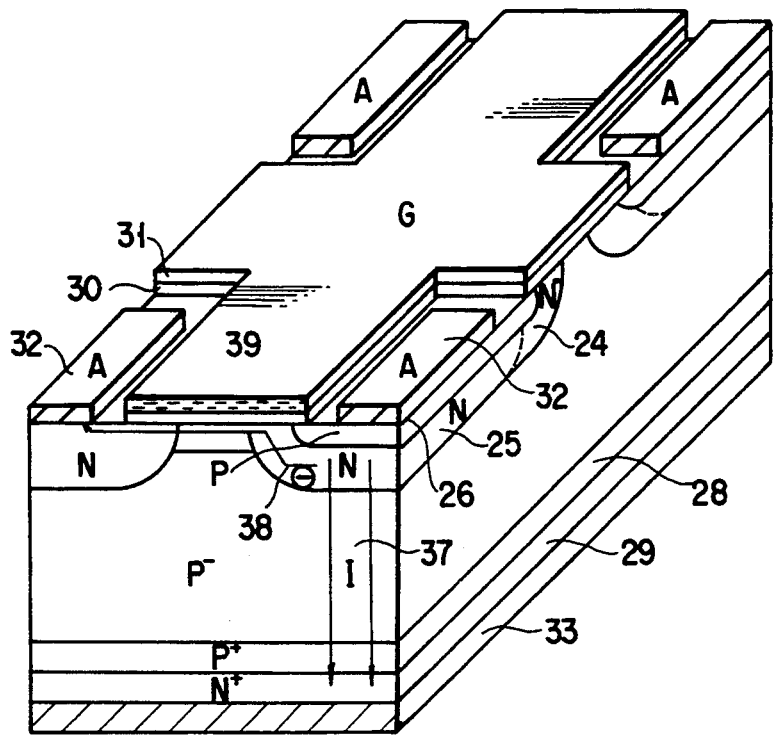
FIG. 17 is a perspective view for explaining a turn-off operation of the MCT shown in FIG. 15.

A second embodiment of the present invention will now be described, with reference to FIGS. 15 to 17. FIG. 15 is a schematic perspective view of an MCT according to the second embodiment of the present invention, and FIGS. 16 and 17 are perspective views of the MCT to explain the turn-on and turn-off operation of the MCT. In the structure of the MCT of the second embodiment, a $P^-$-type silicon semiconductor substrate is substituted for the $N^-$-type silicon semiconductor substrate of the MCT of the first embodiment. As in the first embodiment, a $P^+$-type buffer region 28 and an undersurface $N^+$-type emitter region 29 are formed on the second major surface of a $P^-$-type silicon semiconductor substrate 23. A gate oxide film 30 and a polysilicon gate electrode 31 are formed on the second major surface of the semiconductor substrate, and then impurities are diffused to form an N⁻-type base region 24, an N-type base region 25, a P-type emitter region 26, and an N-type emitter region 27. The gate oxide film 30 is partially opened to form an anode electrode 32, and a cathode electrode 33 is formed on the second major surface of the semiconductor substrate.

A turn-on operation and a turn-off operation of the MCT according to the second embodiment will be described. In the turn-on operation, a positive bias is applied to the anode A, a negative bias is applied to the cathode K, and a negative bias is applied to the gate G, and a P-channel MOSFET is operated to form an inversion layer 36. Then, holes 34 are injected into the P⁻-type base region 23 and electrons 35 are injected from the undersurface N⁺-type emitter region 29. Therefore, the conductivity of the MCT varies in the P⁻-type base region 1, and the MCT turns on to cause the main current to flow. In the turn-on operation, a positive bias is applied to the anode A, a negative bias is applied to the cathode K, and a positive bias is applied to the gate while the main current 37 is flowing. The N-channel MOSFET is thus operated to form an inversion layer 39. The N-type base and emitter regions 25 and 27, and the anode electrode 32 are short-circuited to discharge electrons 38 from the main current and prevent the holes from being injected from the P-type emitter region 26. The main current is thus stopped. Only the relationship between injection and discharge of carriers in the second embodiment is opposite to that in the first embodiment, and the turn-on and turn-off characteristics of the second embodiment are the same as those of the first embodiment.

Figure 20:
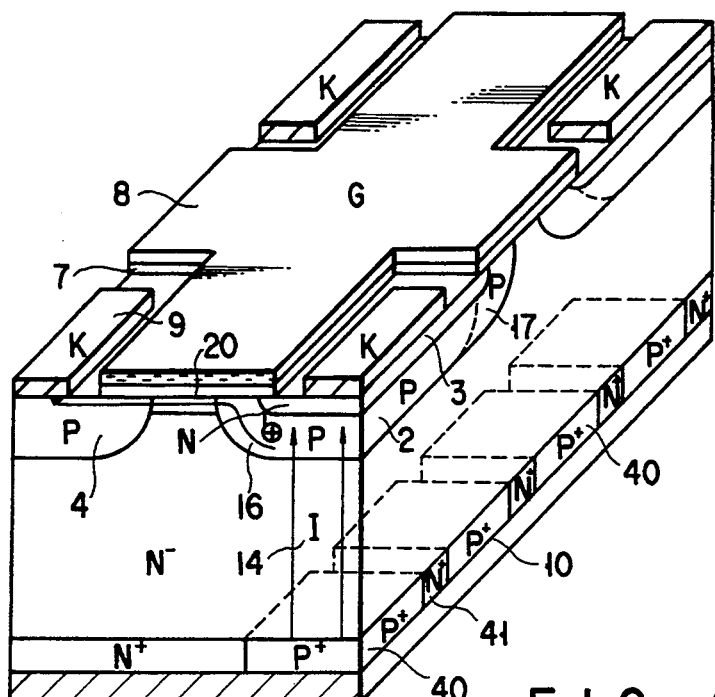
FIG. 20 is a perspective view for explaining a turn-off operation of the MCT shown in FIG. 18.

A third embodiment of the present invention will be described, with reference to FIGS. 18 to 20. FIG. 18 is a schematic perspective view of an MCT according to the third embodiment, and FIGS. 19 and 20 are also schematic perspective views of the MCT to explain its turn-on and turn-off operations. The structure of this MCT is called an anode short structure in which an undersurface P⁺-type emitter region and an undersurface N⁺-type buffer region are short-circuited with each other. An undersurface P⁺-type emitter region 40 and an N⁺-type buffer region 41 are formed on the second major surface of the N⁻-type silicon semiconductor substrate 1, and the gate oxide film 7 and polysilicon gate electrode 8 are formed on the first major surface of the substrate 1. Impurities are diffused from the first major surface to the semiconductor substrate 1 to form the P⁻-type base region 17, P-type base region 2, and N-type emitter region 3. The gate oxide film is partially opened to form the cathode electrode 9, and the anode electrode 10 is formed on the undersurface of the substrate. The turn-on and turn-off operations of the MCT according to the third embodiment are the same as those of the MCT according to the first embodiment. Since, however, the MCT of the third embodiment has the anode short circuit structure, holes are injected from the undersurface P⁺-type emitter region 40 formed directly under the P⁻-type base region 17, and the turn-on operation is performed. In the turn-off operation, since the undersurface P⁺-type emitter regions 40 and the N⁺-type buffer regions 41 are alternately formed directly under the N-type emitter region 3 and no undersurface P⁺-type emitter regions are formed directly under the P-type emitter region 4, the holes vanish quickly. Therefore, the anode short structure of the MCT is easy to operate the turn-off operation.

Figure 23:
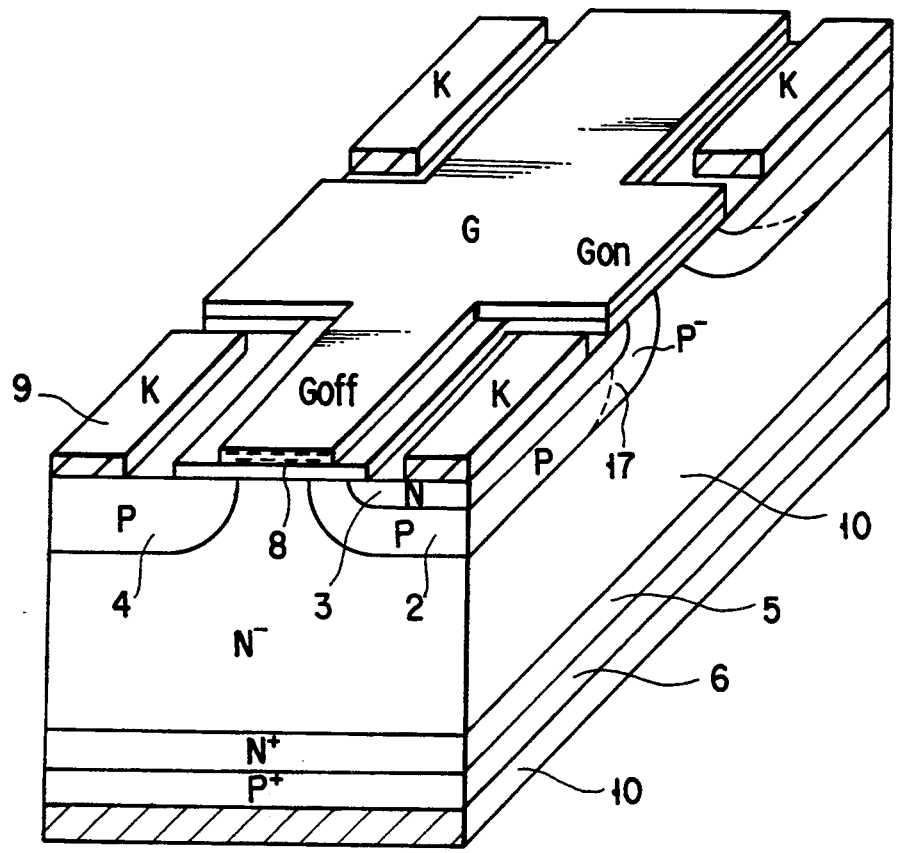
FIG. 23 is a perspective view of an MCT according to a fourth embodiment of the present invention.

A fourth embodiment of the present invention will be described, with reference to FIG. 23. FIG. 23 is a schematic perspective view of an MCT according to the fourth embodiment of the present invention. The structure of the MCT of the fourth embodiment is the same as that of the MCT of the first embodiment, except for the first region Goff (OFF gate region) of the gate electrode 8. In the MCT of the first embodiment shown in FIG. 6, the first region Goff is formed on the N-type emitter region 3. Since the gate is used as a mask when the region 3 is formed by diffusion of impurities, it is unavoidable that the region 3 slightly goes under the gate. Actually, the gate above the region 3 is unnecessary since this portion is used only to turn off the gate (only the off-channel formed in the N⁻-type base region 1 is necessary). In the fourth embodiment, the gate above the N-type emitter region 3 is removed, and the gate oxide film 7 is exposed.

In addition to the above embodiment, the present invention can be applied to a double gate structure. In the above embodiments, silicon is used as a semiconductor. However, the silicon can be replaced with well-known materials such as Ge and GaAs.

As described above, in the present invention, since the initial operation regions for the turn-on and turn-off operations of the MCT are separated from each other, the impurity concentration of the P-type base region can be varied from place to place, the trade-off between the turn-on and turn-off characteristics can be performed satisfactorily, and the turn-off efficiency can be enhanced.

Figure 24:
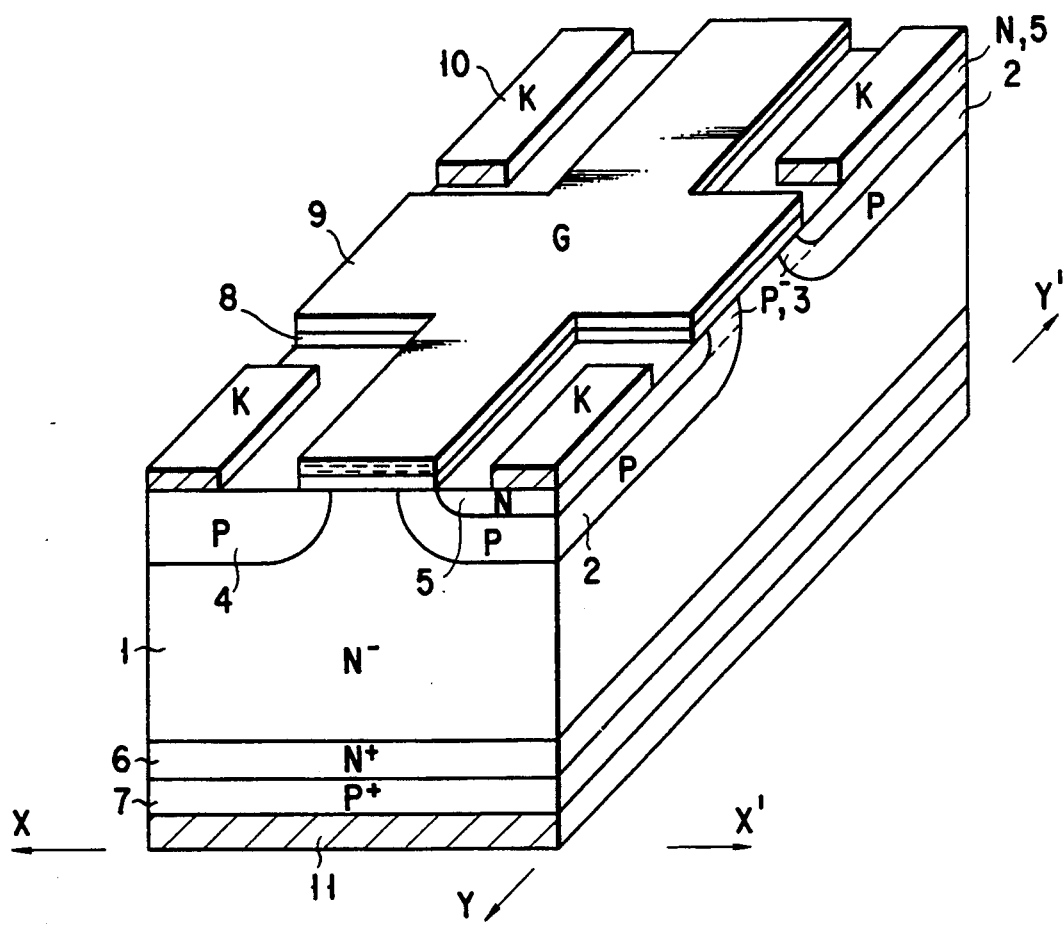
FIG. 24 is a schematic perspective view of an MCT according to a fifth embodiment of the present invention.
Figure 25C:
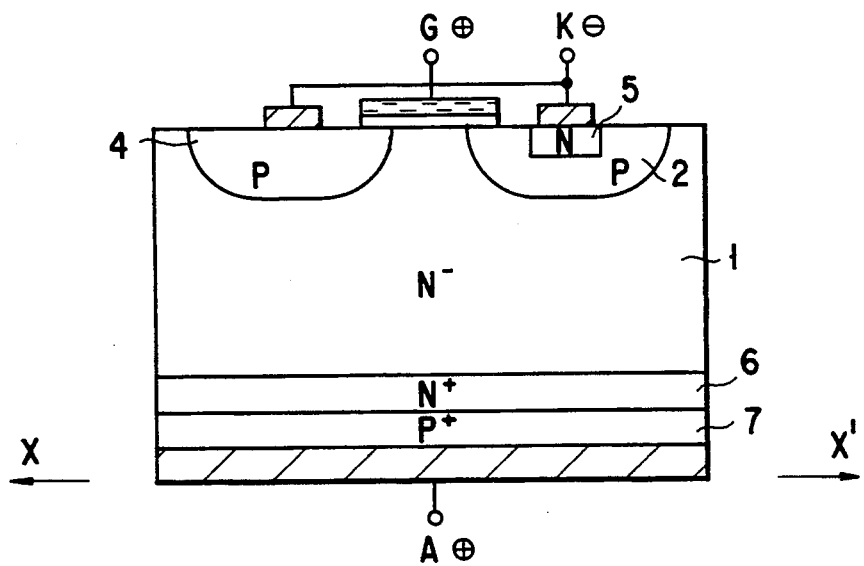
Figure 26A:
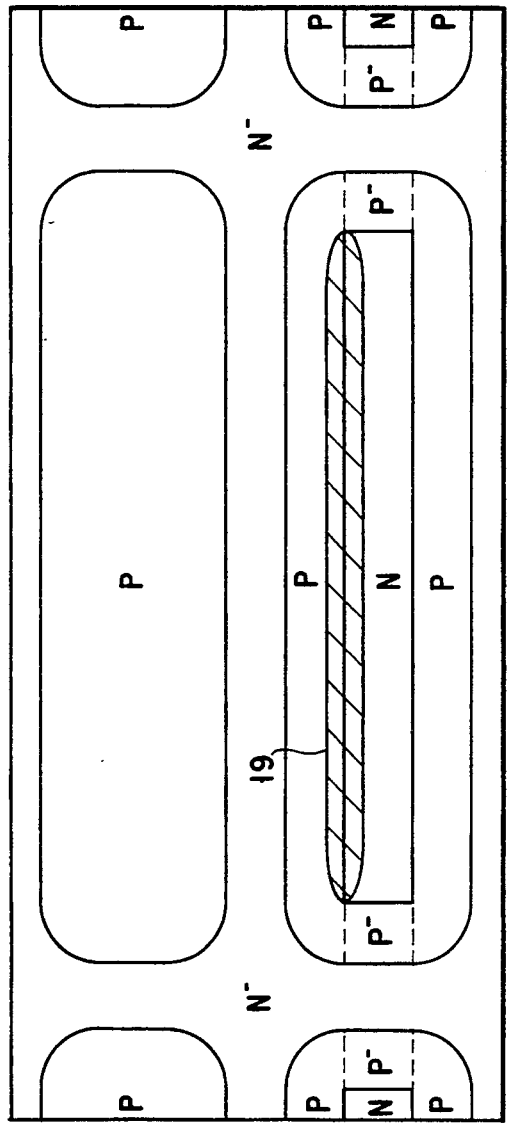
Figure 26B:
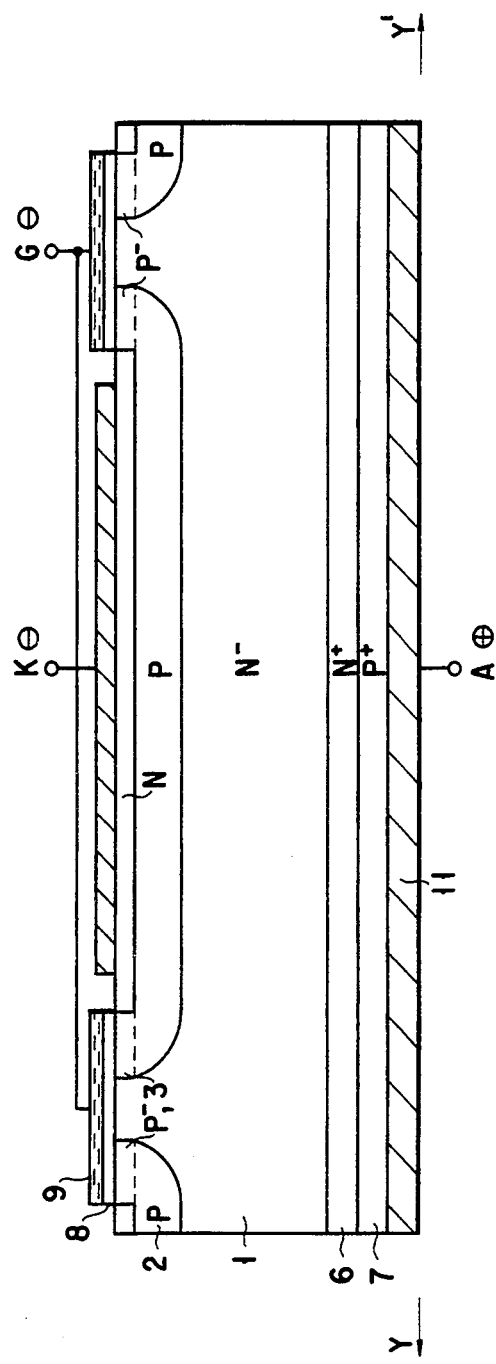
Figure 26C:
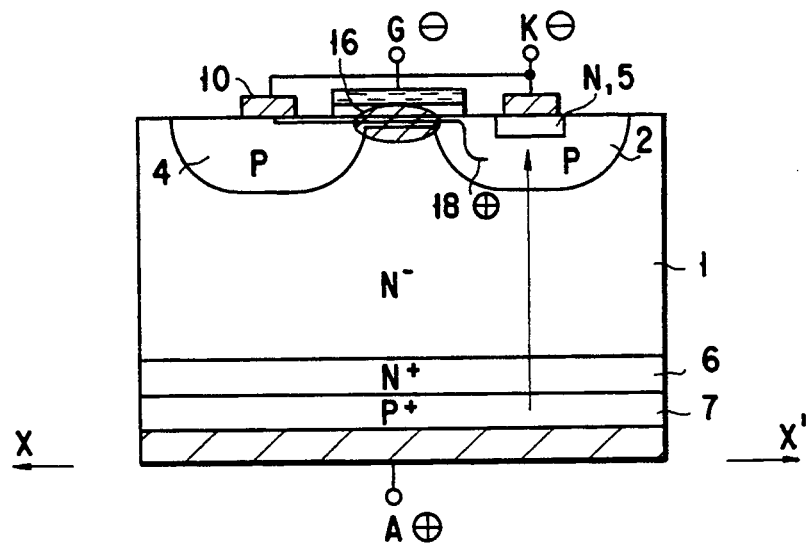

FIG. 24 is a schematic perspective view of an MCT according to a fifth embodiment of the present invention, and FIGS. 25 and 26 are views for explaining turn-on and turn-off operations of the MCT shown in FIG. 24.

A method of manufacturing the MCT shown in FIG. 24 will be described in brief.

An N⁺-type buffer layer 6 is formed on an N⁻-type semiconductor substrate 1, an undersurface P⁺-type emitter layer 7 is formed on the layer 6, and P-type base and drain regions 2 and 4 are formed in the substrate 1 by diffusion of impurities. P-type deposition layers are formed on the surfaces of the regions 2 and 4. An N⁻-type epitaxial layer of about 1 μm is grown on the surface portion of the substrate 1, a gate oxide film 8 and a polysilicon gate electrode 9 are formed on the surface of the N⁻-type epitaxial layer, and a P⁻-type base region 3 and an N-type emitter region 5 are formed in the N⁻-type epitaxial layer by diffusion of impurities. An oxide film is partially opened to form a cathode electrode 10, and an anode electrode 11 is formed on the undersurface of P⁺-type emitter layer 7. Using the epitaxial layer as described above, the P⁻-type base region 3, which was conventionally formed to the same depth as that of the P-type base region, can be formed in only the surface portion of an end portion of the P-type base region.

The MCT can be manufactured by a burying diffusion method or a method using a bonded wafer as well as the above method using the epitaxial layer.

First the turn-on operation of the MCT will be described.

When the anode electrode is positively biased, the cathode electrode is negatively biased, and the gate electrode is positively biased, an N-channel inversion layer 12 is formed on the surface of the P⁻-type base region 3, and electrons are injected from the N-type emitter region 5 into the N⁻-type base region 1. Holes 14 are then injected into the N⁻-type base region 1 from the undersurface P⁺-type emitter layer 7. Therefore, the conductivity of the N⁻-type base region 1 varies, and the electrons are directly injected from the N-type emitter region 5 into the N⁻-type base region 1 through the P-type base region 2. The turn-on operation starts from an N-type emitter region 15 near the P⁻-type base region 3 and extends to the central part of the N-type emitter region 5, thereby turning on the MCT.

Next the turn-off operation of the MCT will be described.

When the anode electrode is positively biased, the cathode electrode is negatively biased, and the gate electrode is negatively biased while a main current 17 is flowing, the N-channel inversion layer 12 formed in the turn-on operation is vanished, and a P-channel inversion layer 16 is formed on the N⁻-type base region 1 between the P-type base and drain regions. The P-type base and drain regions and the cathode electrode are short-circuited, and holes 16 of the main current 17 are discharged from the cathode electrode. Thus, electrons are stopped from being injected from the N-type emitter region 5, and the main current is prevented from flowing. The turn-off operation starts from a region 19 facing the P-type drain region 4 and the N-type emitter region 5, and finally extends to the entire N-type emitter region 5, thereby turning off the MCT.

Needless to say, the MCT according to the fifth embodiment can be applied to a double gate structure and a structure in which the N⁻-type substrate is changed to a P⁻-type substrate, and on- and off-channel regions serve as P- and N-channel MOSFETs, respectively.

Figure 27:
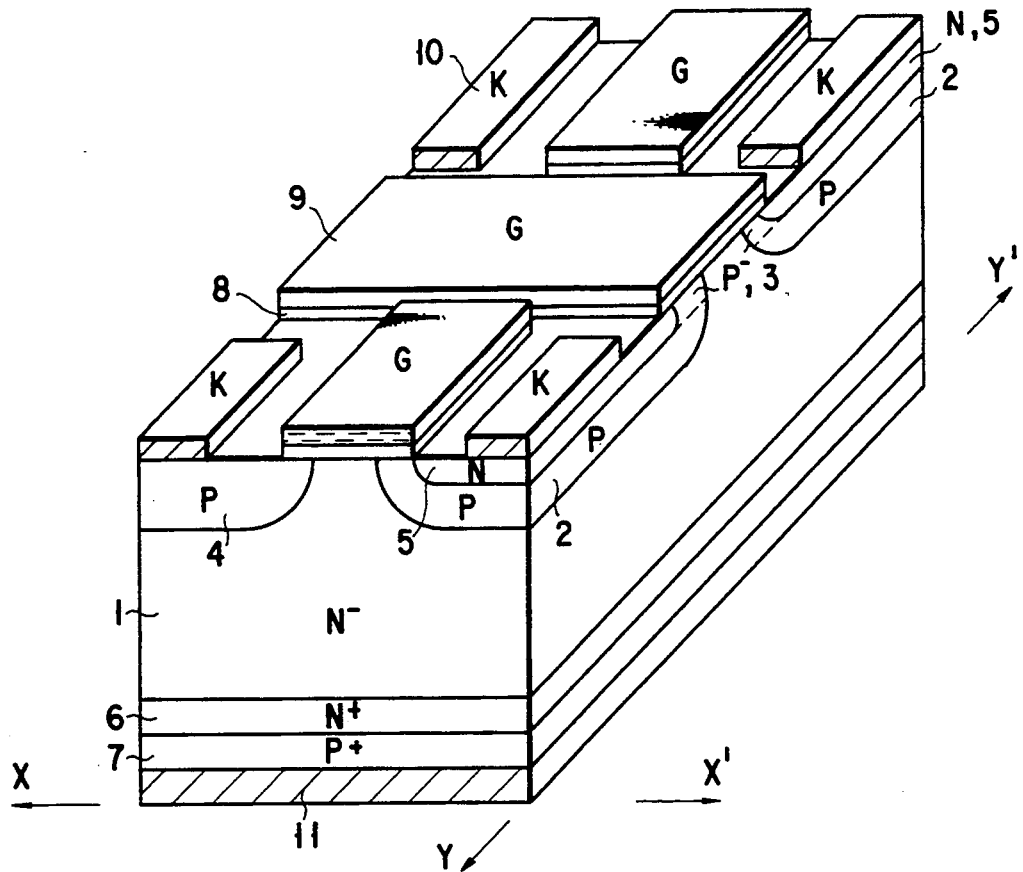
FIG. 27 is a schematic perspective view of an MCT according to a sixth embodiment of the present invention.

As shown in FIG. 27, an MCT having ON and OFF gate regions which are formed separately from each other, can be applied to the present invention.

The advantage of the MCT according to the fifth embodiment of the present invention is to improve the turn-off characteristic. According to the conventional MCT shown in FIG. 1, the turn-off characteristic is improved, using a method of efficiently discharging holes by increasing the concentrations of the P-type base and drain regions 2 and 4 and decreasing the resistances of current paths of the P-type base region, P-channel inversion layer, P-type drain region, and cathode electrode, through which the holes are discharged.

In the above method, however, since the resistance of the current path of the P⁻-type base region 3 formed at low concentration and serving as an ON gate region, is high, hole current components are difficult to discharge through the current path, and the conductive state is maintained at this path. Therefore, the current is easy to remain when the turn-on operation is performed, which prevents the turn-off characteristic from improving.

To resolve the above problem, in the present invention, the P⁻-type base region is formed in only the surface portion of an end portion of the P-type base region. If the P⁻-type base region is formed in only the surface portion of an end portion of the P-type base region in which the N-channel inversion layer is to be formed in the turn-on operation, the resistance of the path through which the hole current flows in the turn-off operation, is decreased, and the current easily flow.

The advantage of the fifth embodiment will be described, with reference to FIGS. 24, 25 and 26.

The P⁻-type base region 3 is formed in the surface portion of the P-type base region 2 so as to extend from a junction between the P-type base region 2 and the N-type emitter region 5 to a junction between the P-type base region 2 and the N-type base region 1. The P⁻-type base region 3 is thus formed in the portion where the N-channel inversion layer 12 is formed in the turn-on operation. In the MCT, the anode electrode is positively biased, the cathode electrode is negatively biased, and the gate is negatively biased while the main current is flowing. Therefore, the P-channel inversion layer 16 is formed on the surface of the N⁻-type base region between the P-type base and drain regions, the P-type base and drain regions and the cathode electrode are short-circuited, and the holes 16 of the main current are discharged from the cathode electrode.

With the above operation, the electrons are stopped from being injected from the N-type emitter region 5. Since, in this time, the P⁻-type base region 3 is surrounded with the P-type base region 2 at a junction between the end portion of the P-type base region 2 and the N-type emitter region 5, the N-channel inversion layer 12 formed in the turn-on operation is vanished, and the electrons are easy to stop, thereby improving the turn-off characteristic of the MCT.

In the conventional MCT, the P⁻-type base region is formed in the entire end portion of the P-type base region which contacts the N-type emitter region. However, in the present invention, the P⁻-type base region 3 is formed in only the surface portion of the end portion of the P-type base region 2, so that the injection of electrons is controlled, and the turn-off characteristic is improved. In contrast, since the P⁻-type base region 3 is formed in a region where the N-channel inversion layer 12 is to be formed, the characteristic of the N-channel MOSFET is the same as that in the conventional MCT, and the electrons are sufficiently injected from the N-channel inversion layer into the N⁻-type base region 1. Therefore, the same turn-on operation as that of the conventional MCT is performed, and the turn-on characteristic is the same as that in the conventional MCT.

As described above, the turn-off characteristic can be improved, without degrading the turn-on characteristic. The tradeoff between the turn-on and turn-off characteristics in a device design is improved.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A MOS gate type thyristor comprising:
    a semiconductor substrate of a first conductivity type having first and second major surfaces;
    a first semiconductor region of a second conductivity type formed in said first major surface of said semiconductor substrate;
    a second semiconductor region of the first conductivity type formed in a surface of said first semiconductor region;
    a third semiconductor region of the second conductivity type formed in said first major surface of said semiconductor substrate;

a fourth semiconductor region of the second conductivity type formed in said second major surface of said semiconductor substrate;

a fifth semiconductor region of the second conductivity type formed at one end of said first semiconductor region, said fifth semiconductor region contacting said second semiconductor region and having an impurity concentration which is lower than that of said first semiconductor region;

a first electrode formed on said second semiconductor region;

a second electrode formed on said third semiconductor region;

a third electrode formed on said fourth semiconductor region;

a gate oxide film formed on said semiconductor substrate, said first, second, and third semiconductor regions so as to overlap said semiconductor substrate, a first boundary between said semiconductor substrate and said first semiconductor region, a second boundary between said first and second semiconductor regions, and a third boundary between said semiconductor substrate and said fifth semiconductor region; and a gate electrode formed on said gate oxide film, said gate electrode including an ON gate region and an OFF gate region, said ON gate region being located above said fifth semiconductor region, and said OFF gate region being located in a position between said first and third semiconductor regions.

2. The thyristor according to claim 1, wherein a fifth semiconductor region of the second conductivity type is formed at one end of said first semiconductor region, said fifth semiconductor region contacts said second semiconductor region and has an impurity concentration lower than that of said first semiconductor region.

3. The thyristor according to claim 2, wherein said second semiconductor region has a substantially rectangular shape, and that portion of said second semiconductor region which contacts said fifth semiconductor region is shorter than that portion of said second semiconductor region which contacts said first semiconductor region.

4. The thyristor according to claim 1, further comprising a sixth semiconductor region of the first conductivity type, which is formed between said semiconductor substrate and said fourth semiconductor region and which has an impurity concentration higher than that of said semiconductor substrate.

5. A MOS gate type thyristor comprising:
a semiconductor substrate of a first conductivity type having first and second major surfaces;
a first semiconductor region of a second conductivity type formed in said first major surface of said semiconductor substrate;
a second semiconductor region of the first conductivity type formed in a surface of said first semiconductor region;
a third semiconductor region of the second conductivity type formed in said first major surface of said semiconductor substrate;
a fourth semiconductor region of the second conductivity type formed in said second major surface of said semiconductor substrate;
a fifth semiconductor region of the second conductivity type located at one end of said first semiconductor region, said fifth semiconductor region contacting said second semiconductor region, and having an impurity concentration lower than that of said first semiconductor region;
a first electrode formed on said second semiconductor region;
a second electrode formed on said third semiconductor region;
a third electrode formed on said fourth semiconductor region;
a gate oxide film formed on said semiconductor substrate, said first, second and third semiconductor regions so as to overlap said semiconductor substrate, a first boundary between said semiconductor substrate and said first semiconductor region, a second boundary between said first and second semiconductor regions, and a third boundary between said semiconductor substrate and said fifth semiconductor region; and
a gate electrode formed on said gate oxide film, said gate electrode including an ON gate region and an OFF gate region, said ON gate region being located above said fifth semiconductor region, and said OFF gate region being located in a position between said first and third semiconductor regions.

6. The thyristor according to claim 5, wherein said second semiconductor region has a substantially rectangular shape, and that portion of said semiconductor region which contacts said fifth semiconductor region is shorter than that portion of said semiconductor region which contacts said first semiconductor region.

7. A thyristor according to claim 5, further comprising a sixth semiconductor region of the first conductivity type, which is formed between said semiconductor substrate and said fourth semiconductor region and whose impurity concentration is higher than that of said semiconductor substrate.

8. A MOS gate type thyristor comprising:
a semiconductor substrate of a first conductivity type having first and second major surfaces;
a first semiconductor region of a second conductivity type formed in said first major surface of said semiconductor substrate, said first semiconductor region having a substantially rectangular shape;
a second semiconductor region of the first conductivity type formed in a surface of said first semiconductor region, said second conductivity region having a substantially rectangular shape;
a third semiconductor region of the second conductivity type formed in said first major surface of said semiconductor substrate;
a fourth semiconductor region of the second conductivity type formed in said second major surface of said semiconductor substrate;
a fifth semiconductor region of the second conductivity type located at longitudinal ends of said first semiconductor region, said fifth semiconductor region contacting said second semiconductor region, and having an impurity concentration lower than that of said first semiconductor region;
a first electrode formed on said second semiconductor region;
a second electrode formed on said third semiconductor region:
a third electrode formed on said fourth semiconductor region;
gate oxide film formed on said semiconductor substrate, said first, second, and third semiconductor regions so as to overlap said semiconductor substrate, a first boundary between said semiconductor substrate and said first semiconductor region, a second boundary between said first and second semiconductor regions, and a third boundary between said semiconductor substrate and said fifth semiconductor region; and a gate electrode formed on said gate oxide film, said gate electrode including an ON gate region and an OFF gate region, said ON gate region being located above said fifth semiconductor region, and said OFF gate region being located in a position between said first and third semiconductor regions, wherein a plurality of sixth semiconductor regions of the second conductivity type are formed in said fourth semiconductor region at predetermined intervals.

9. A MOS gate type thyristor comprising:

a semiconductor substrate of a first conductivity type having first and second major surfaces;

first and second semiconductor regions of a second conductivity type formed in said first major surface of said semiconductor substrate;

third and fourth semiconductor regions of the first conductivity type, each of said third and fourth semiconductor regions being formed in a surface of said first and second semiconductor regions, respectively;

fifth and sixth semiconductor regions of the second conductivity type formed in said first major surface of said semiconductor substrate;

a seventh semiconductor region of the second conductivity type formed on said second major surface or said semiconductor substrate;

eighth and ninth semiconductor regions of the second conductivity type, each being formed at one end of said respective first and second semiconductor regions, said eighth and ninth semiconductor regions contacting said third and fourth semiconductor regions, and having an impurity concentration lower than that of said first and second semiconductor regions;

first, second, third, and fourth electrodes, each being formed on respective ones of said third to sixth semiconductor regions;

a fifth electrode formed on said seventh semiconductor region;

a first gate electrode constituting a first MOS transistor, said first gate electrode, together with said semiconductor region, first semiconductor region, and fifth semiconductor region, being used for turning off the thyristor; and a second gate electrode constituting a second MOS transistor, said second gate electrode, together with said semiconductor substrate, said first and second semiconductor regions, being used for turning on the thyristor.

10. A MOS gate type thyristor comprising:

a semiconductor substrate of a first conductivity type having first and second major surfaces;

a first semiconductor region of a second conductivity type formed in said first major surface of said semiconductor substrate;

a second semiconductor region of the first conductivity type formed in a surface of said first semiconductor region;

a third semiconductor region of the second conductivity type formed in said first major surface of said semiconductor substrate;

a fourth semiconductor region of the second conductivity type formed in said second major surface of said semiconductor substrate;

a fifth semiconductor region of the second conductivity type formed at one end of said first semiconductor region, said fifth semiconductor region contacting said second semiconductor region and having an impurity concentration lower than that of said first semiconductor region;

a first electrode formed on said second semiconductor region;

a second electrode formed on said third semiconductor region;

a third electrode formed on said fourth semiconductor region;

a gate oxide film formed on said semiconductor substrate, said first, second, and third semiconductor regions so as to overlap said semiconductor substrate, a first boundary between said semiconductor substrate and said first semiconductor region, a second boundary between said first and second semiconductor regions, and a third boundary between said semiconductor substrate and said fifth semiconductor region; and a gate electrode formed on said gate oxide film, said gate electrode including an ON gate region and an OFF gate region, said ON gate region being located in a position corresponding to that of said fifth semiconductor region, and said OFF gate region being located in a position between said first and third semiconductor regions.

11. A MOS gate type thyristor comprising:

a semiconductor substrate of a first conductivity type having first and second major surfaces;

a first semiconductor region of a second conductivity type formed in a said first major surface of said semiconductor substrate, said second semiconductor region having a substantially rectangular shape;

a second semiconductor region of the first conductivity type formed in a surface of said first semiconductor region, said second semiconductor region having a substantially rectangular shape;

a third semiconductor region of the second conductivity type formed in said first major surface of said semiconductor substrate;

a fourth semiconductor region of the second conductivity type formed in said second major surface of said semiconductor substrate;

a fifth semiconductor region of the second conductivity type located at longitudinal ends of said first semiconductor region, said fifth semiconductor region contacting said second semiconductor region, and having an impurity concentration lower than that of said first semiconductor region;

a first electrode formed on said second semiconductor region;

a second electrode formed on said third semiconductor region;

a third electrode formed on said fourth semiconductor region;

a gate oxide film formed on said semiconductor substrate, said first, second and third semiconductor regions so as to overlap said semiconductor substrate, a first boundary between said semiconductor substrate and said first semiconductor region, a second boundary between said first and second semiconductor regions, and a third boundary between said semiconductor substrate and said fifth semiconductor region; and a gate electrode formed on said gate oxide film, said gate electrode including an ON gate region and an OFF gate region, said ON gate region being located in a position corresponding to that of said fifth semiconductor region, and said OFF gate region being located in a position between said first and third semiconductor regions.

12. The thyristor according to any one of claims 1, 5 and 9, wherein a plurality of cells constituting the thyristor are formed in said semiconductor substrate.

* * * * *